(12) United States Patent
Hidaka

(10) Patent No.: US 6,996,002 B2
(45) Date of Patent: Feb. 7, 2006

(54) THIN FILM MAGNETIC MEMORY DEVICE PROVIDED WITH MAGNETIC TUNNEL JUNCTIONS

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/060,305

(22) Filed: Feb. 18, 2005

(65) Prior Publication Data

US 2005/0146925 A1 Jul. 7, 2005

Related U.S. Application Data

(63) Continuation of application No. 10/441,088, filed on May 20, 2003, now Pat. No. 6,868,005.

(30) Foreign Application Priority Data

Nov. 14, 2002 (JP) ............................. 2002-330922

(51) Int. Cl.
*G11C 11/14* (2006.01)
(52) U.S. Cl. ..................................... 365/171; 365/226
(58) Field of Classification Search ................ 365/171, 365/226
See application file for complete search history.

(56) References Cited

U.S. PATENT DOCUMENTS 6,349,054 B1 2/2002 Hidaka
6,788,571 B2 * 9/2004 Ooishi et al. ................ 365/171
6,842,366 B2 * 1/2005 Tanizaki et al. ............ 365/171
2003/0117838 A1 6/2003 Hidaka
2003/0117869 A1 6/2003 Hidaka

OTHER PUBLICATIONS

Scheuerlein, et al. "A 10ns Read and Write Non-Volatile Memory Array Using a Magnetic Tunnel Junction and FET Switch in Each Cell" 2000 IEEE International Solid-State Circuits Conference Digest of Technical Papers TA 7.2.
Durlam, et al. "Nonvolatile RAM Based on Magnetic Tunnel Junction Elements" 2000 IEEE International Solid-State Circuits Conference Digest of Technical Papers TA 7.3.
Naji, et al. "A 256kb 3.0V 1T1MTJ Nonvolatile Magnetoresistive RAM" 2001 IEEE International Solid-State Circuits Conference Digest of Technical Papers (Feb. 6, 2001) 7.6.

* cited by examiner

*Primary Examiner*—Michael Tran
(74) *Attorney, Agent, or Firm*—McDermott Will & Emery LLP

(57) ABSTRACT

A driver transistor supplying a data write current to a write digit line is arranged to have its gate length direction along the same direction with a write digit line. Further, the write digit line has a reinforced portion arranged between an ordinary portion corresponding to a region where memory cells are arranged and a power supply interconnection, having interconnection cross sectional area greater than that of the ordinary portion. With this configuration, the chip area can be decreased as an increase of layout pitch of the memory cells dependent on the driver transistor size is prevented, and operational reliability can also be improved as a local increase of the current density on the write digit line is avoided.

8 Claims, 19 Drawing Sheets

THIN FILM MAGNETIC MEMORY DEVICE PROVIDED WITH MAGNETIC TUNNEL JUNCTIONS

RELATED APPLICATION

This application is a continuation of application Ser. No. 10/441,088, filed May 20, 2003 now U.S. Pat. No. 6,868,005.

BACKGROUND OF THE INVENTION

1. Field of the Invention

The present invention relates to thin film magnetic memory devices, and more particularly to a thin film magnetic memory device provided with memory cells having magnetic tunnel junctions (MTJ).

2. Description of the Background Art

In recent years, a magnetic random access memory (MRAM) device has attracted attention as a new-generation nonvolatile memory device. The MRAM device performs nonvolatile data storage using a plurality of thin film magnetic elements formed on a semiconductor integrated circuit, permitting random accesses to the respective thin film magnetic elements. In particular, recent announcement, as in Roy Scheuerlein, "A 10 ns Read and Write Non-Volatile Memory Array Using a Magnetic Tunnel Junction and FET Switch in each Cell", 2000 IEEE ISSCC Digest of Technical Papers, TA7.2, shows that performance of the MRAM device is significantly improved by using thin film magnetic elements utilizing magnetic tunnel junctions as memory cells.

A memory cell having a magnetic tunnel junction (hereinafter, also referred to as the "MTJ memory cell") can be configured with an MTJ element and an access element (e.g., transistor), which is advantageous to higher integration. The MTJ element has a magnetic layer that can be magnetized in a direction in accordance with an applied magnetic field. The MTJ memory cell stores data by utilizing the characteristic that electric resistance (junction resistance) within the MTJ element changes according to the magnetization direction of the magnetic layer.

To read data stored in an MTJ memory cell, it is necessary to detect a difference between the electric resistances corresponding to the stored data levels. Specifically, data read is carried out based on a current passing through the MTJ memory cell that changes in amount according to the electric resistance (i.e., the stored data).

Data write to an MTJ memory cell is carried out by supplying data write currents to two write lines to generate data write magnetic fields. The data write magnetic fields are generated from the respective write lines in directions along an easy axis (easy-to-magnetize axis) and a hard axis (hard-to-magnetize axis), respectively, of the MTJ memory cell. At the time of data write, the data write magnetic field in the hard axis direction is applied to rotate the magnetization direction of the MTJ memory cell and, at the same time, the data write magnetic field in the easy axis direction is applied, so that the MTJ memory cell is magnetized in a direction (along the easy axis direction) in accordance with data to be written.

The data write current in the MRAM device is generally on the order of some milliamperes to ten-odd milliamperes to generate a magnetic field of prescribed intensity required for data write. Thus, it is necessary to ensure that a driver transistor supplying the data write current has adequate current driving capability. This, however, would cause the following problems characteristic to the MRAM devices.

(1) When the driver transistor is so increased in size to assure sufficient current driving capability that it cannot be accommodated in the layout pitch of the write lines, the MTJ memory cell size and hence the chip area would increase.

(2) With increased current densities in the write lines, electromigration or the like would occur to impair operational reliability.

(3) Electric resistance of a data write current path would increase due to the resistances of interconnections included in the path and contacts connecting the interconnection layers, making it difficult to supply a sufficient amount of data write current.

Particularly, in recent years, memory devices have actively been mounted to battery-driven portable equipment, for which low-voltage operation is strongly demanded from the standpoint of low power consumption. In such a low-voltage operation, the problem of (3) above would be most serious. That is, a configuration assuring supply of the data write current of a level enough for data write even in the low-voltage operation, would be required.

SUMMARY OF THE INVENTION

An object of the present invention is to provide a thin film magnetic memory device which has a configuration permitting stable and efficient supply of a data write current without an increase of memory cell size.

The thin film magnetic memory device according to the present invention includes a plurality of magnetic memory cells each having a magnetic layer magnetized in a direction in accordance with stored data, a write line for passing therethrough a data write current for generating a data write magnetic field for magnetization of said magnetic layer, and a current driving circuit coupling the write line between first and second voltages at the time of data write to supply the data write current. The current driving circuit includes a field effect transistor electrically coupled between one of the first and second voltages and the write line. The field effect transistor is arranged such that its gate length direction matches a direction along which the write line extends.

Accordingly, the main advantage of the present invention is that in the thin film magnetic memory device, the field effect transistor (driver transistor) for supplying a data write current is arranged such that its gate length direction extends in the same direction as a write line supplied with the data write current, and thus, high-density memory cell arrangement is possible without being impaired by the layout pitch of the driver transistors.

The thin film magnetic memory device according to another configuration of the present invention includes a plurality of magnetic memory cells each having a magnetic layer magnetized in a direction in accordance with stored data, a power supply interconnection for supply of a prescribed voltage, and a write line for passing therethrough a data write current for generating a data write magnetic field for magnetization of the magnetic layer. The write line is electrically coupled to the power supply interconnection at least when the data write current is passed therethrough. The write interconnection includes a first portion having a first cross sectional area and corresponding to a region in which the plurality of memory cells are arranged, and a second portion having a second cross sectional area that is greater than the first cross sectional area and provided in at least a portion between the first portion and the power supply interconnection.

Accordingly, in the thin film magnetic memory device of this configuration, a reinforced portion having a cross sectional area greater than that of an ordinary portion is provided between the write line and the power supply interconnection. Thus, even if the interconnection width decreases at the end of the write line due to migration of metallic atoms at the time of supply of data write current, it is possible to avoid the risk that a sudden increase of current density in the relevant portion would adversely affect the operational reliability.

The thin film magnetic memory device according to a further configuration of the present invention includes a plurality of magnetic memory cells each having a magnetic layer magnetized in a direction in accordance with stored data, a power supply pad receiving supply of a prescribed voltage, a power supply interconnection electrically coupled to the power supply pad via a contact provided in a vertical direction; and a first write line formed in the same interconnection layer with the power supply interconnection along a direction crossing the power supply interconnection. The first write line is coupled to the power supply interconnection in the same interconnection layer so that a first data write current for generating a data write magnetic field for magnetization of the magnetic layer is passed through the first write line.

Accordingly, in the thin film magnetic memory device of this configuration, the power supply interconnection and the write line are coupled in the same interconnection layer, and the power supply pad and the power supply interconnection are directly connected to each other via a contact, without crossing a plurality of interconnection layers. This can reduce the electric resistance of the data write current path. As a result, it is possible to readily acquire a prescribed data write current even if a power supply voltage is set relatively low.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
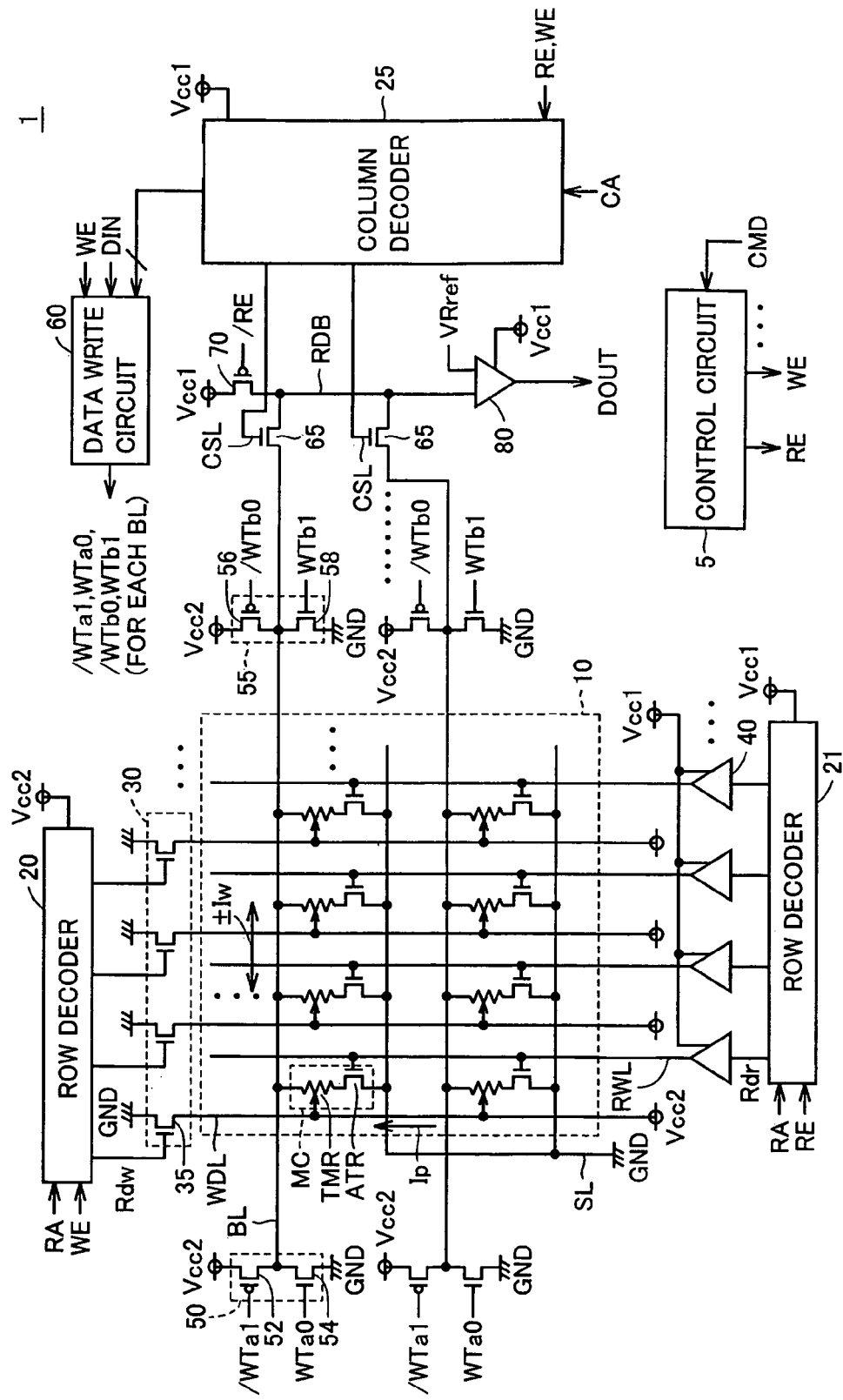
FIG. 1 shows an overall configuration of the MRAM device 1 according to a first embodiment of the present invention.

Hereinafter, embodiments of the present invention will be described in detail with reference to the drawings. In the drawings, the same or corresponding portions are denoted by the same reference characters.

First Embodiment (Overall Configuration and Data Read and Write Operations)

Referring to FIG. 1, the MRAM device 1 according to the first embodiment of the present invention is provided with a control circuit 5 which receives a command control signal CMD and controls the overall operation of the MRAM device, and a memory cell array 10. Memory cell array 10 has a plurality of MTJ memory cells MC arranged in rows and columns. Here, the configuration and data storage principle of the MTJ memory cell are described with reference to FIG. 2.

Figure 2:
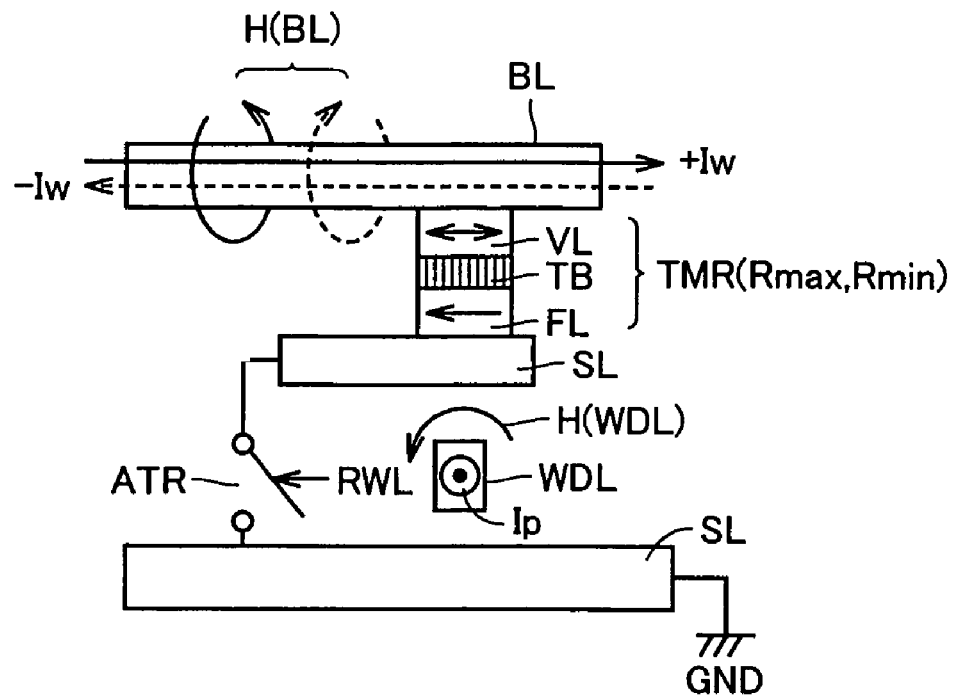
FIG. 2 is a conceptual diagram illustrating structure and data storage principle of an MTJ memory cell.

Referring to FIG. 2, a tunneling magneto-resistance element TMR has a ferromagnetic material layer FL having a fixed, constant magnetization direction (hereinafter, also simply referred to as "fixed magnetic layer FL"), and a ferromagnetic material layer VL which can be magnetized in a direction according to an externally applied magnetic field (hereinafter, also simply referred to as "free magnetic layer VL"). A tunneling barrier (tunneling film) TB of an insulator film is provided between fixed magnetic layer FL and free magnetic layer VL. Free magnetic layer VL is magnetized in the same or opposite direction with respect to fixed magnetic layer FL, in accordance with a level of stored data being written. Fixed magnetic layer FL, tunneling barrier TB and free magnetic layer VL form a magnetic tunnel junction.

The electric resistance of tunneling magneto-resistance element. TMR changes according to a relative relation between the magnetization directions of fixed magnetic layer FL and free magnetic layer VL. Specifically, the electric resistance of tunneling magneto-resistance element TMR becomes a minimal value Rmin when fixed magnetic layer FL and free magnetic layer VL have the same (parallel) magnetization directions, and it becomes a maximal value Rmax when they have the opposite (anti-parallel) magnetization directions.

At the time of data write, a read word line RWL is inactivated, and an access transistor ATR is turned off. In this state, a data write current Ip of a prescribed direction is passed through a write digit line WDL for generating a data write magnetic field H(WDL) along a hard axis (HA) of free magnetic layer VL. On the other hand, a data write current +Iw or −Iw is passed through a bit line BL for generating a data write magnetic field H(BL) along an easy axis (EA) of free magnetic layer VL. That is, the data write current on bit line BL is controlled to have a direction in accordance with a level of data to be written. Hereinafter, data write currents +Iw and −Iw will also be represented collectively as data write current ±Iw.

Now, a relation between the data write current of the MTJ memory cell and the magnetization direction of the tunneling magneto-resistance element is described with reference to FIG. 3.

Figure 3:
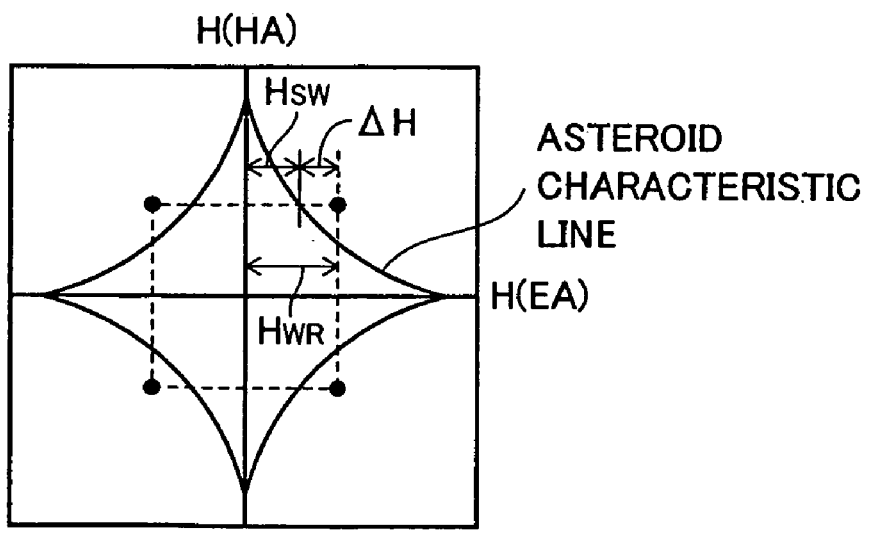
FIG. 3 is a conceptual diagram illustrating a relation between a data write current of the MTJ memory cell and a magnetization direction of a tunneling magneto-resistance element.

Referring to FIG. 3, the horizontal axis H(EA) represents a magnetic field being applied to free magnetic layer VL in tunneling magneto-resistance element TMR in the easy axis (EA) direction. The vertical axis H(HA) represents a magnetic field which acts on free magnetic layer VL in the hard axis (HA) direction. Magnetic fields H(EA) and H(HA) correspond to the two magnetic fields generated by the respective currents passing through bit line BL and write digit line WDL.

In the MTJ memory cell, the fixed magnetization direction of fixed magnetic layer FL is along the easy axis of free magnetic layer VL. Free magnetic layer VL is magnetized along the easy axis direction, parallel or anti-parallel (opposite) to the magnetization direction of fixed magnetic layer FL, in accordance with the level of the stored data. The MTJ memory cell can store data of one bit, correlated with the two magnetization directions of free magnetic layer VL.

The magnetization direction of free magnetic layer VL can be rewritten only in the case where a sum of applied magnetic fields H(EA) and H(HA) reaches a region outside the asteroid characteristic line shown in FIG. 3. That is, the magnetization direction of free magnetic layer VL would not change when the data write magnetic fields applied have intensity that falls into the region inside the asteroid characteristic line.

As seen from the asteroid characteristic line, a magnetization threshold value necessary to cause a change in magnetization direction of free magnetic layer VL along the easy axis can be lowered by applying to free magnetic layer VL the magnetic field in the hard axis direction. As shown in FIG. 3, an operating point at the time of data write is set such that the stored data in the MTJ memory cell, i.e., the magnetization direction of tunneling magneto-resistance element TMR, can be rewritten when prescribed data write currents are passed through write digit line WDL and bit line BL.

With the operating point shown by way of example in FIG. 3, in the MTJ memory cell as a target of data write, the data write magnetic field in the easy axis direction is set to have an intensity of HWR. That is, the data write current value passed through bit line BL or write digit line WDL is set to obtain the data write magnetic field HWR. In general, data write magnetic field $H_{WR}$ is represented as a sum of a switching magnetic field HSW necessary for switching of the magnetization directions and a margin ΔH, i.e., HWR=HSW+ΔH.

The magnetization direction once written into tunneling magneto-resistance element TAR, i.e., the stored data in the MTJ memory cell, is held in a non-volatile manner until data write is newly performed.

Referring again to FIG. 1, control circuit 5 responds to command control signal CMD and generates various kinds of control signals for controlling the internal operations of MRAM device 1. These control signals include a control signal RE that is activated to a high level (hereinafter, "H level") for a prescribed time period at the time of data read, and a control signal WE that is activated to an H level for a prescribed time period at the time of data write.

In memory cell array 10, read word lines RWL and write digit lines WDL are arranged corresponding to respective rows of MTJ memory cells MC, and bit lines BL are arranged corresponding to respective columns of MTJ memory cells MC. Each MTJ memory cell MC has a tunneling magneto-resistance element TMR and an access transistor ATR connected in series between corresponding bit line BL and a source voltage line SL. Access transistor ATR is typically formed of an N-MOS transistor, which has its gate connected to corresponding read word line RWL. Source voltage line SL connected to a source of every access transistor ATR supplies a ground voltage GND. Hereinafter, the MOS transistor is shown as a representative of the field effect transistor.

Now, configuration and operation of data write-related circuits in MRAM device 1 are described.

MRAM device 1 is provided with a row decoder 20, a write digit line drive circuit 30, bit line drivers 50, 55 provided corresponding to each memory cell column, and a data write circuit 60.

Row decoder 20 generates a row decode signal Rdw for each memory cell row, based on a row address RA. At the time of data write, row decoder 20 activates row decode signal Rdw of a selected memory cell row (hereinafter, also referred to as the "selected row") to an H level (power supply voltage Vcc2), and inactivates row decode signals Rdw of the remaining memory cell rows (hereinafter, also referred to as the "non-selected rows") to a low level (hereinafter, "L level"). During a period other than the data write, row decoder 20 inactivates every row decode signal Rdw to an L level (ground voltage GND).

Write digit line drive circuit 30 has driver transistors 35 each connected between one end of respective write digit line WDL and ground voltage GND. Driver transistor 35 is formed of an N-MOS transistor having its gate receiving row decode signal Rdw of the corresponding memory cell row. The other end of each write digit line WDL is connected to power supply voltage Vcc2 irrelevant to a row select result.

Thus, in a selected row at the time of data write, corresponding driver transistor 35 turns on in response to activation (to an H level) of row decode signal Rdw, and a data write current Ip flows through write digit line WDL of the selected row in a direction from power supply voltage Vcc2 to write digit line drive circuit 30.

Bit line driver 50 has driver transistors 52 and 54 which are connected between one end of corresponding bit line BL and power supply voltage Vcc2 and ground voltage GND, respectively. Similarly, bit line driver 55 has driver transistors 56 and 58 which are connected between the other end of corresponding bit line BL and power supply voltage Vcc2 and ground voltage GND, respectively. Bit line drivers 50, 55 are formed of C-MOS drivers. That is, driver transistors 52, 56 are each formed of a P-MOS transistor, and driver transistors 54, 58 are each formed of an N-MOS transistor.

Driver transistors 52 and 54 have their gates receiving write control signals/WTa1 and WTa0, respectively, and driver transistors 56 and 58 have their gates receiving write control signals/WTb0 and WTb1, respectively.

In each memory cell column, bit line driver 50 responds to write control signals/WTa1 and WTa0, and drives the one end of corresponding bit line BL to either power supply voltage Vcc2 or ground voltage GND, or disconnects the same from both of them to cause a floating state. Similarly, bit line driver, 55 drives the other end of corresponding bit line BL to either power supply voltage Vcc2 or ground voltage GND, or none of them to cause a floating state, in accordance with write control signals/WTb0 and WTb1. Each bit line BL in the floating state is precharged to a fixed voltage as necessary, by a precharge circuit (not shown).

Data write circuit 60 controls write control signals/WTa1, WTa0, /WTb0, WTb1 in each memory cell column, in accordance with written data DIN and a column select result. Write control signals/WTa1, WTa0, /WTb0, WTb1 are set such that data write current ±Iw flows through bit line BL of a selected column in a direction in accordance with written data DIN.

During a period other than data write, data write circuit 60 sets write control signals/WTa1, /WTb0 to an H level (power supply voltage Vcc2) and write control signals WTa0, WTb1 to an L level (ground voltage GND) in each memory cell column. Thus, every bit line BL is set to a floating state during the period other than the data write.

Further, data write circuit 60 sets each of write control signals /WTa1, WTa0, /WTb0, WTb1 corresponding to a non-selected memory cell column at the time of data write, to an H level. Thus, bit line BL of a non-selected column at the time of data write has its both ends connected to ground voltage GND to prevent a flow of an unintended current therethrough.

By comparison, data write circuit 60 sets levels of write control signals/WTa1, WTa0, /WTb0, WTb1 corresponding to a selected memory cell column at the time of data write, in accordance with written data DIN. Specifically, when written data DIN is at an H level, write control signals /WTa1 and WTa0 are set to an L level, and write control signals/WTb0 and WTb1 are set to an H level. Thus, data write current +Iw flows through bit line BL of the selected column in a direction from bit line driver 50 to bit line driver 55.

On the other hand, when written data DIN is at an L level, write control signals/WTa1 and WTa0 are set to an H level, and write control signals/WTb0 and WTb1 are set to an L level. Thus, data write current −Iw flows through bit line BL of the selected column in a direction from bit line driver 55 to bit line driver 50. Alternatively, the drive voltages of bit line drivers 50, 55 may be set to any arbitrary voltages other than ground voltage GND and power supply voltage Vcc2.

Driver transistors 52, 54, 56, 58 may be formed of MOS transistors of the same conductivity type. In this case, the driver transistors employing the MOS transistors of the opposite conductivity type from those in the example shown in FIG. 1 are configured to have their gates receiving inverse levels of the corresponding write control signals shown in FIG. 1, to allow the bit line control in the same manner.

In MTJ memory cell MC having corresponding write digit line WDL and bit line BL through both of which data write currents flow (i.e., in the selected memory cell), data of a level in accordance with the direction of data write current ±Iw on bit line BL is magnetically written.

Now, configuration and operation of data read-related circuits in MRAM device 1 are described.

MRAM device 1 is further provided with a row decoder 21, a read select gate 65, a current supply transistor 70, and a data read circuit 80.

Row decoder 21 generates row decode signals Rdr for respective memory cell rows based on row addresses RA. At the time of data read, row decoder 21 activates row decode signal Rdr of a selected row to an H level (power supply voltage Vcc1), and inactivates row decode signal Rdr of a non-selected row to an L level (ground voltage GND).

Thus, at the time of data read, read word line RWL of a selected row is activated to an H level, and read word line RWL of a non-selected row is inactivated to an L level, in accordance with row decode signals Rdr. On the other hand, during a period other than data read, every read word line RWL is inactivated to an L level. As a result, at the time of data read, access transistors ATR turn on in the memory cells in the selected row, and each bit line BL is pulled down to ground voltage GND via tunneling magneto-resistance element TMR of corresponding MTJ memory cell MC.

Read select gate 65 is provided between each bit line BL and a read data bus RDB. It turns on or off in response to a corresponding column select line CSL. Column select line CSL is activated to an H level in a column selected at the time of data read (hereinafter, also referred to as the "selected column"), and is inactivated to an L level in the remaining columns (hereinafter, also referred to as the "non-selected columns"). During a period other than data read, every column select line CSL is inactivated to an L level.

Thus, at the time of data read, read data bus RDB is pulled down to ground voltage GND via read select gate 65 and bit line BL of the selected column and tunneling magneto-resistance element TMR of the selected memory cell. In this state, read data bus RDB is pulled up to power supply voltage Vcc1 by current supply transistor 70 which turns on at the time of data read.

Current supply transistor 70 is formed, e.g., of a P-MOS transistor, which is connected between power supply voltage Vcc1 and read data bus RDB and has its gate receiving a control signal/RE. Control signal/RE is an inverse signal of control signal RE generated by control circuit 5, and is activated to an L level for a prescribed time period during the data read. As a result, at the time of data read, a voltage occurs on read data bus RDB in accordance with the electric resistance (i.e., stored data) of the selected memory cell.

Data read circuit 80 is supplied with power supply voltage Vcc1 and ground voltage GND for operation. It amplifies a voltage difference between a voltage of read data bus RDB and a read reference voltage VRref, to generate read data DOUT indicating the stored data in the selected memory cell. Read reference voltage VRref is set to an intermediate level between the voltage of read data bus RDB in the case where it is connected to a selected memory cell having its stored data corresponding to electric resistance Rmin, and the voltage of read data bus RDB in the case where it is connected to a selected memory cell having its stored data corresponding to electric resistance Rmax. Data is thus read out of the selected memory cell.

Power supply voltage Vcc2 is set to a voltage greater than power supply voltage Vcc1 so as to supply a sufficient amount of data write current. Power supply voltage Vcc1 corresponds to a voltage being applied to tunneling film TB (FIG. 2) at the time of data read, which cannot be set to a great voltage from the standpoint of reliability. That is, power supply voltage Vcc1 for the data read-related circuitry and power supply voltage Vcc2 for the data write-related circuitry are set to separate voltages satisfying Vcc2>Vcc1, which ensures stable execution of both data read and data write.

(Configuration for Supplying Data Write Current)

Now, a configuration of data write current supplying circuitry for efficiently and stably supplying a data write current with a small circuit area, is described.

Figure 4:
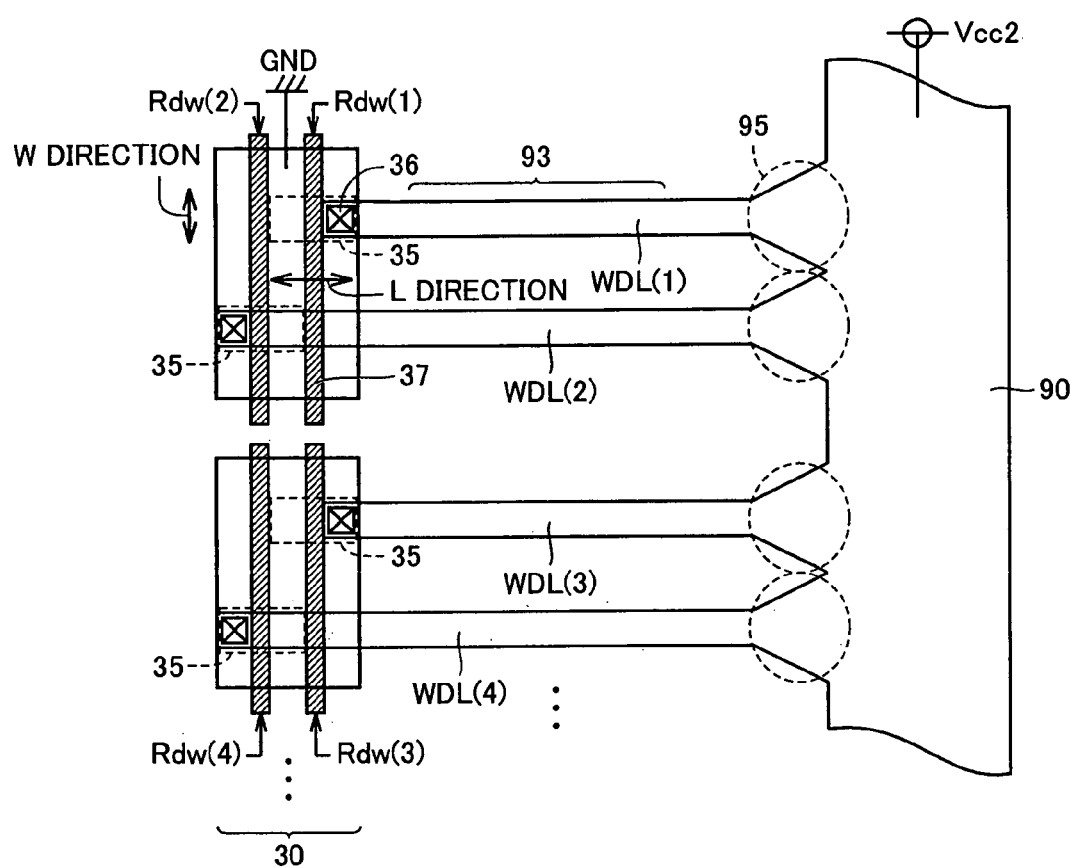
FIG. 4 is a conceptual diagram showing a first configuration example of the data write current supplying circuitry with respect to write digit lines according to the first embodiment.

FIG. 4 is a conceptual diagram showing a first configuration example of the data write current supplying circuitry with respect to write digit line WDL according to the first embodiment. Although FIG. 4 representatively shows a two-dimensional layout of the data write current supplying configuration with respect to write digit lines WDL(1)–WDL(4) in the first through fourth rows, the similar configuration is provided for the other write digit line WDL.

Driver transistors 35 formed of N-MOS transistors are each connected between one end of respective write digit line WDL(1)–WDL(4) and ground voltage GND. Driver transistor 35 is arranged such that a current passing direction, i.e., its gate length direction (L direction) matches a direction along which write digit line WDL extends.

Driver transistor 35 has its source coupled to ground voltage GND, and its drain electrically coupled to write digit line WDL via a contact 36.

Independent gate interconnections 37 are provided corresponding to respective driver transistors 35. For example, gate interconnection 37 of driver transistor 35 corresponding to write digit line WDL(1) transmits a row decode signal Rdw(1) therethrough. Row decode signal Rdw(1) is activated to an H level when a first memory cell row is selected at the time of data write, and otherwise inactivated to an L level. In each driver transistor 35, gate interconnection 37 arranged along the gate width direction (W direction) is consequently arranged in a direction crossing write digit line WDL.

If driver transistor 35 were arranged to make its gate width direction (W direction) match the arranged direction of write digit line WDL, the layout pitch in the vertical direction of FIG. 4 (pitch direction of write digit line WDL) would increase.

Generally, the layout pitch of write digit line WDL can be set to a minimal value corresponding to the minimal design rule of the MTJ memory cell. With an arrangement where the gate width direction of driver transistors 35 matches the arranged direction of write digit line WDL, however, it needs to be designed such that the gate length of driver transistor 35, a contact region to its source and drain, and a width of insulative film separating the neighboring driver transistors all fall within the layout pitch of write digit line WDL described above.

In particular, to supply an adequate amount of data write current Ip without considerably increasing the size of driver transistor 35, the level of power supply voltage Vcc2 should be set high. Especially in such a case, the transistor size in the gate length direction becomes large to withstand breakdown, resulting in mismatch between the layout pitch of write digit line WDL and the layout pitch according to the minimal design rule of the MTJ memory cell. This hinders higher integration of the MTJ memory cells.

Based on the foregoing, as shown in FIG. 4, each driver transistor 35 is arranged to have its gate length direction (L direction) to match the arranged direction of write digit line VVDL, which overcomes the obstacle to the higher integration of the MTJ memory cells attributable to the layout pitch of driver transistors 35.

As another feature of the configuration according to the first embodiment, write digit line WDL has a reinforced portion 95 that is provided between an ordinary portion 93 corresponding to a region where the MTJ memory cells are arranged and a power supply interconnection 90. Reinforced portion 95 is designed to have its cross sectional area greater than that of ordinary portion 93.

Figure 5A:
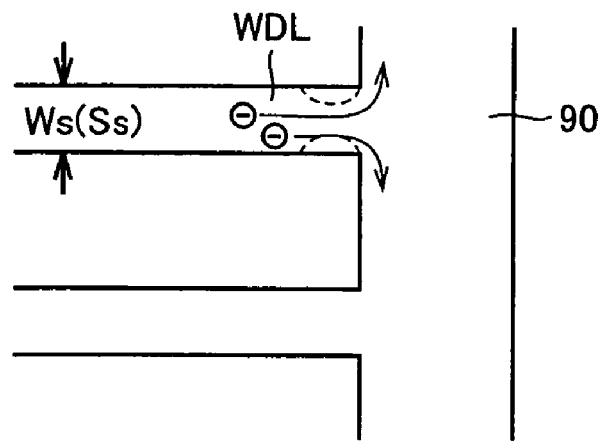
FIGS. 5A–5C are conceptual diagrams showing design examples of the write digit lines according to the first embodiment.
Figure 5B:
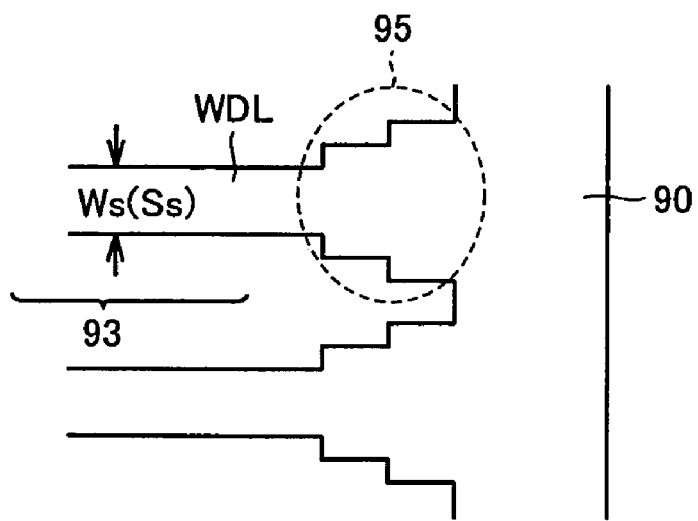
Figure 5C:
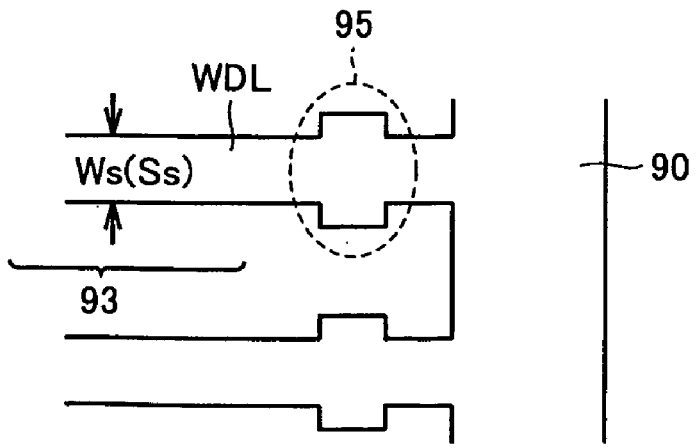

FIGS. 5A–5C show design examples of the write digit lines according to the first embodiment.

FIG. 5A illustrates a problem encountered by write digit line WDL having a uniform interconnection width (or interconnection cross sectional area).

Referring to FIG. 5A, at the time of supply of a data write current, electrons travel from write digit line WDL toward power supply interconnection 90, during which the electrons cause material atoms (e.g., Al, Cu) of the interconnection to move near the end of write digit line WDL. Repetition thereof would narrow the interconnection width of write digit line WDL, as shown in the dotted lines, thereby decreasing the cross sectional area thereof. The relevant portion would suffer a local increase of current density, which may cause breaking of wire due to electromigration or the like, leading to deterioration of operational reliability.

Accordingly, as shown in FIG. 5B, write digit line VVDL is provided with reinforced portion 95 near its end (on the power supply interconnection 90 side) where the interconnection width is gradually increased compared to that of ordinary portion 93 to thereby increase the cross sectional area. This can reduce, even if the interconnection width decreases due to migration of metallic atoms as described above, the risk that the current density suddenly increases in the relevant portion to adversely affect the operational reliability. Alternatively, the reinforced portion may be formed by increasing the interconnection width (cross sectional area) in a portion of write digit line WDL in the vicinity of its end, as shown in FIG. 5C.

By comparison, in ordinary portion 93 of write digit line WDL corresponding to the region where the MTJ memory cells are being arranged, the ordinary interconnection width Ws (cross sectional area Ss) according to the minimal design rule of the MTJ memory cell is maintained, permitting high-density arrangement of the MTJ memory cells.

Figure 6:
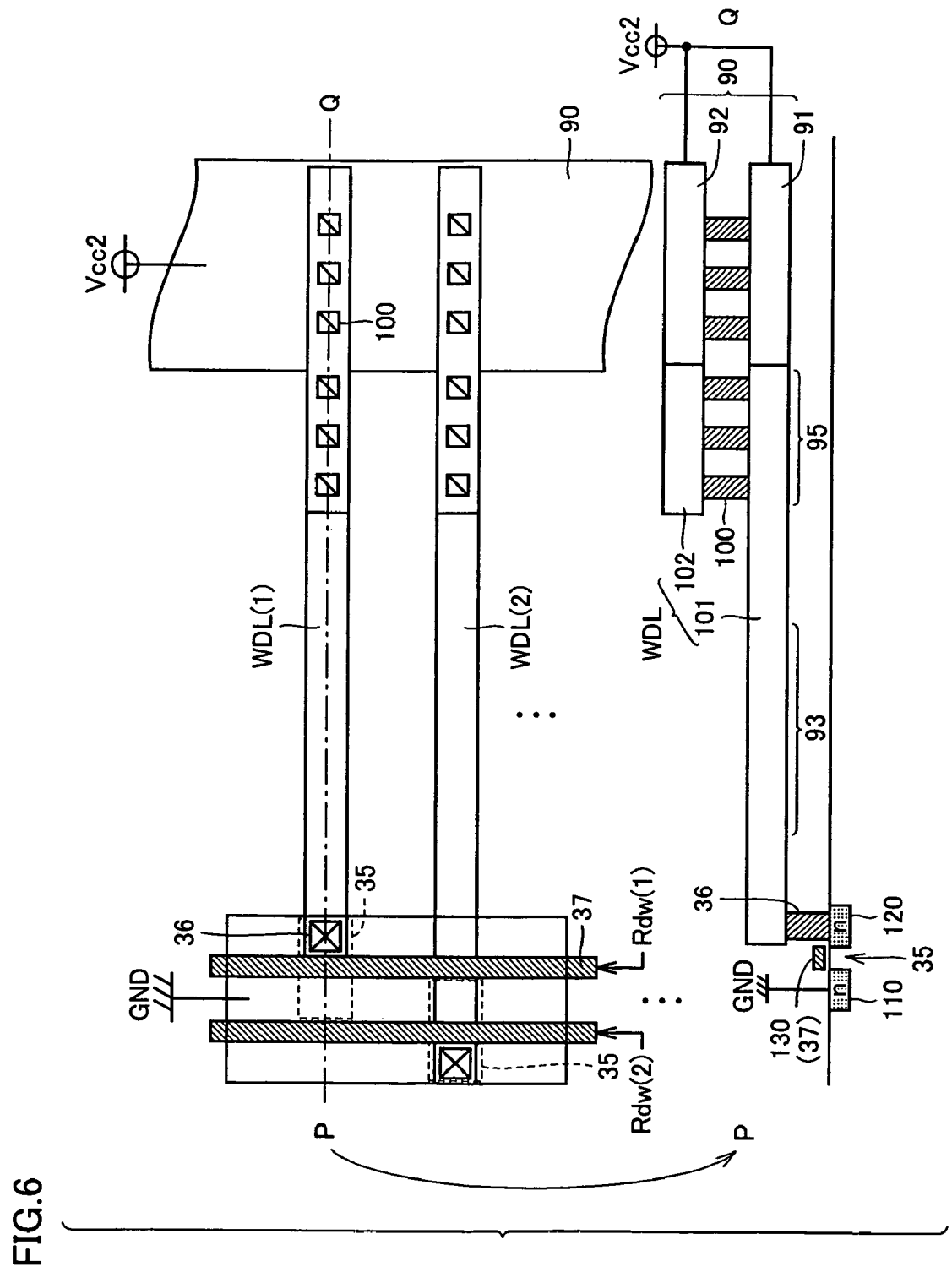
FIGS. 6–8 are conceptual diagrams showing second through fourth configuration examples of the data write current supplying circuitry for the write digit lines according to the first embodiment.

FIG. 6 is a conceptual diagram showing a second configuration example of the data write current supplying circuitry for write digit line WDL according to the first embodiment. Although FIG. 6 representatively shows a two-dimensional layout of the data write current supplying configuration with respect to write digit lines WDL(1) and WDL(2) corresponding to the first and second rows, respectively, the identical configuration is provided for the other write digit line WDL.

Referring to FIG. 6, in the second configuration example, reinforced portion 95 of write digit line WDL, having greater cross sectional area than ordinary portion 93, is formed of a plurality of interconnections that are arranged in a plurality of interconnection layers, respectively, and electrically coupled to each other via a contact 100. Driver transistor 35 is arranged to have its gate length direction to match the write digit line WDL direction, as in the configuration example shown in FIG. 4.

Referring to the P–Q cross sectional view in FIG. 6, write digit line WDL is made of interconnections 101 and 102 formed in the respective interconnection layers. Interconnection 101 corresponds to the ordinary portion 93 of write digit line WDL, and interconnection 102 is formed in the interconnection layer other than that of interconnection 101, in a region corresponding to the reinforced portion 95. Interconnections 101 and 102 are electrically coupled to each other via contact 100 formed in a via hole.

In the respective interconnection layers, interconnections 101 and 102 are directly electrically coupled to interconnections 91 and 92 constituting power supply interconnection 90. That is, interconnections 91 and 92 are both supplied with power supply voltage Vcc2. Interconnections 91 and 92 are also electrically coupled to each other via a contact provided in a via hole.

Driver transistor 35 has impurity regions 110, 120 and a gate 130. Impurity region 110 functions as a source supplied with ground voltage GND. The other impurity region 120 functions as a drain, electrically coupled to interconnection 101 via contact 36. A gate interconnection 37 is placed at gate 130. Although not shown, the cross sectional view of driver transistor 35 in FIG. 4 is the same as in FIG. 6.

With such a configuration, the data write current path formed on write digit line WDL upon turn-on of driver transistor 35 comes to include both interconnections 101 and 102 in reinforced portion 95. As a result, the interconnection cross sectional area equivalently increases in reinforced portion 95 within write digit line WDL than in ordinary portion 93. As such, a local increase of the current density can be avoided, as in the layouts 15, shown in FIGS. 5B and 5C.

Particularly, in the configuration example of FIG. 6, interconnections 101 and 102 can be designed uniformly in shape, which facilitates manufacture of the interconnections compared to the cases of FIGS. 5B and 5C. Further, it is devoid of two-dimensional widening, and thus applicable to the case where the layout pitch corresponds to the minimum feature length.

Figure 7:
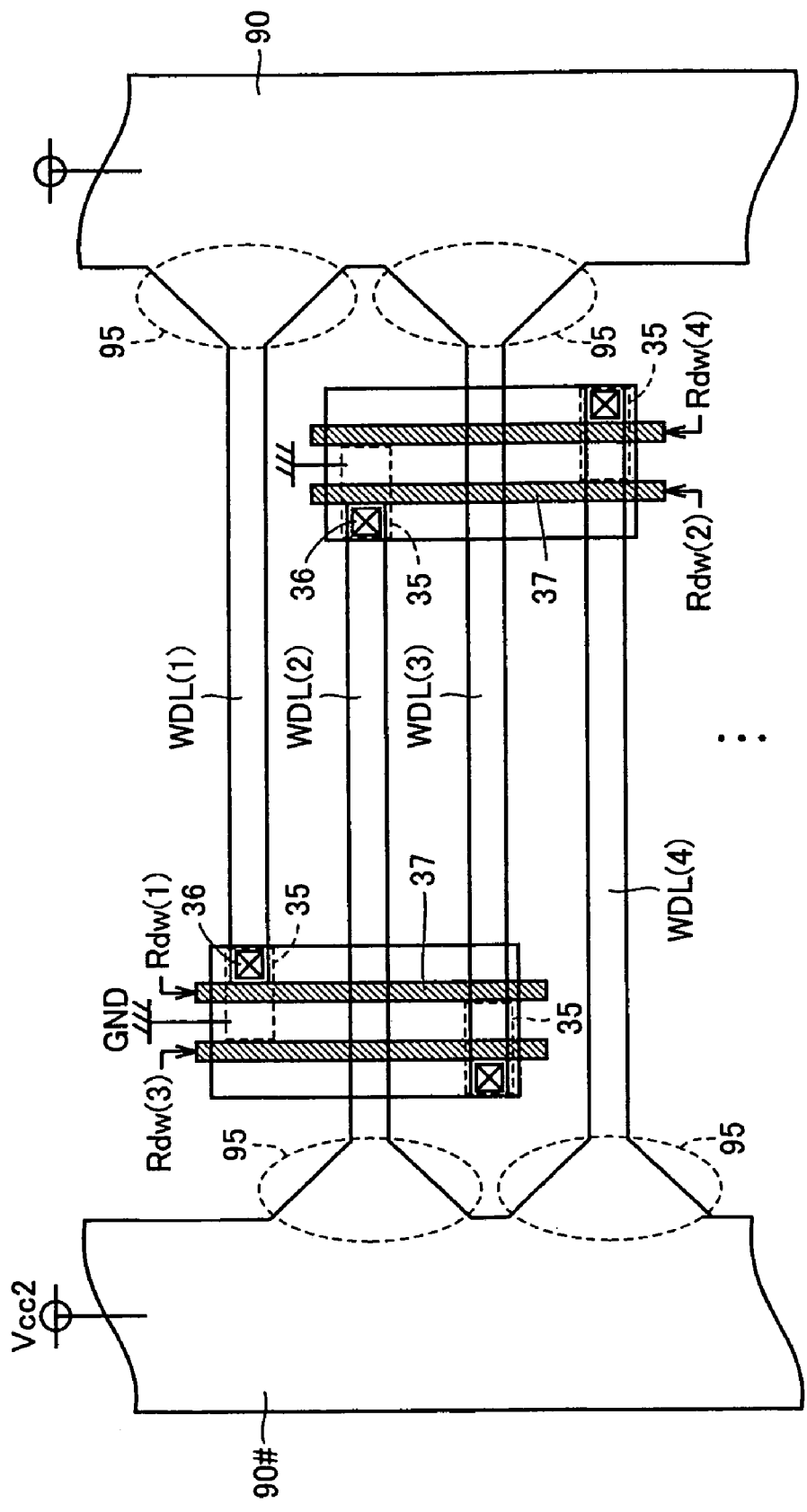

FIG. 7 is a conceptual diagram showing a third configuration example of the data write current supplying circuitry with respect to write digit line WDL according to the first embodiment. Although FIG. 7 representatively shows a two-dimensional layout of the data write current supplying configuration for write digit lines WDL(1)–WDL(4) corresponding to first through fourth rows, respectively, the identical configuration is provided for the other write digit line WDL.

Referring to FIG. 7, in the third configuration example, driver transistors 35 are each arranged on either end of write digit line WDL alternately for every other write digit line WDL. In response, power supply interconnections 90 and 90# are arranged on the remaining ends of respective write digit lines WDL.

That is, write digit lines WDL(1), WDL(3), . . . in odd rows are electrically coupled to power supply interconnection 90, and write digit lines WDL(2), WDL(4), . . . in even rows are electrically coupled to power supply interconnection 90#. Each write digit line WDL has reinforced portion 95 as shown in FIG. 4, 5B or 5C provided between the corresponding power supply interconnection 90, 90# and ordinary portion 93.

Such alternating arrangement of driver transistors 35 in every other rows alleviates the layout pitch of driver transistor 35, permitting more efficient arrangement thereof. Such alternating arrangement is effective when power supply voltage Vcc2 is set relatively higher than the other power supply voltages.

In particular, in the case where reinforced portion 95 is obtained by two-dimensional widening of the interconnection, as in FIGS. 5B and 5C, the degree of freedom in dimension increases in this region. This permits still more efficient arrangement of driver transistors 35.

In FIG. 7, the configuration example where driver transistors 35 are arranged alternately for every other row has been shown. The similar effects can be obtained with a configuration where driver transistors 35 are arranged alternately for every two or more write digit lines WDL.

Figure 8:
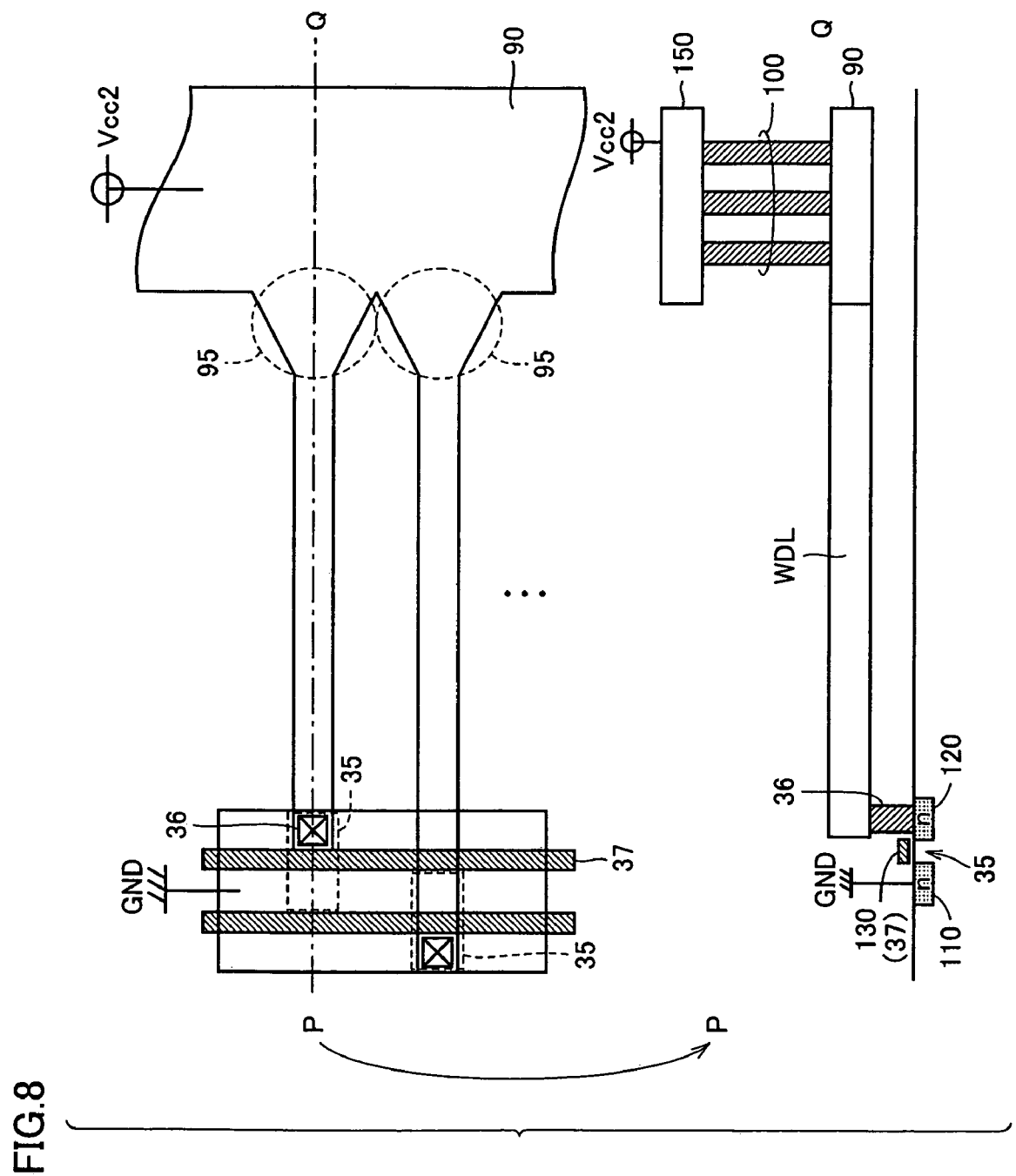

FIG. 8 is a conceptual diagram showing a fourth configuration example of the data write current supplying circuitry with respect to write digit line, WDL according to the first embodiment. Although FIG. 8 representatively shows a two-dimensional layout of the data write current supplying configuration for write digit lines WDL(1) and WDL(2) corresponding to first and second rows, respectively, the identical configuration is provided for the other write digit line WDL.

As seen from the P–Q cross section in FIG. 8, in the fourth configuration example, write digit line WDL is provided at the lowermost interconnection layer in the MRAM device. Further, power supply interconnection 90 is provided in the same interconnection layer as write digit line WDL, with power supply interconnection 90 and write digit line WDL being electrically coupled with each other by the relevant interconnection layer.

Power supply interconnection 90 is electrically coupled via a contact 100 to a power supply pad 150 which is supplied with power supply voltage Vcc2 from the outside of the MRAM device. Particularly, electric resistance between power supply pad 150 and power supply interconnection 90 can be alleviated as power supply pad 150 and power supply interconnection 90 are coupled via the contact directly, not across a plurality of interconnection layers. Such a design readily assures sufficient cross sectional area of contact 100, or a sufficient number of contacts arranged in parallel. Driver transistors 35 are arranged as shown in FIG. 6, and thus, detailed description thereof is not repeated here.

Figure 9:
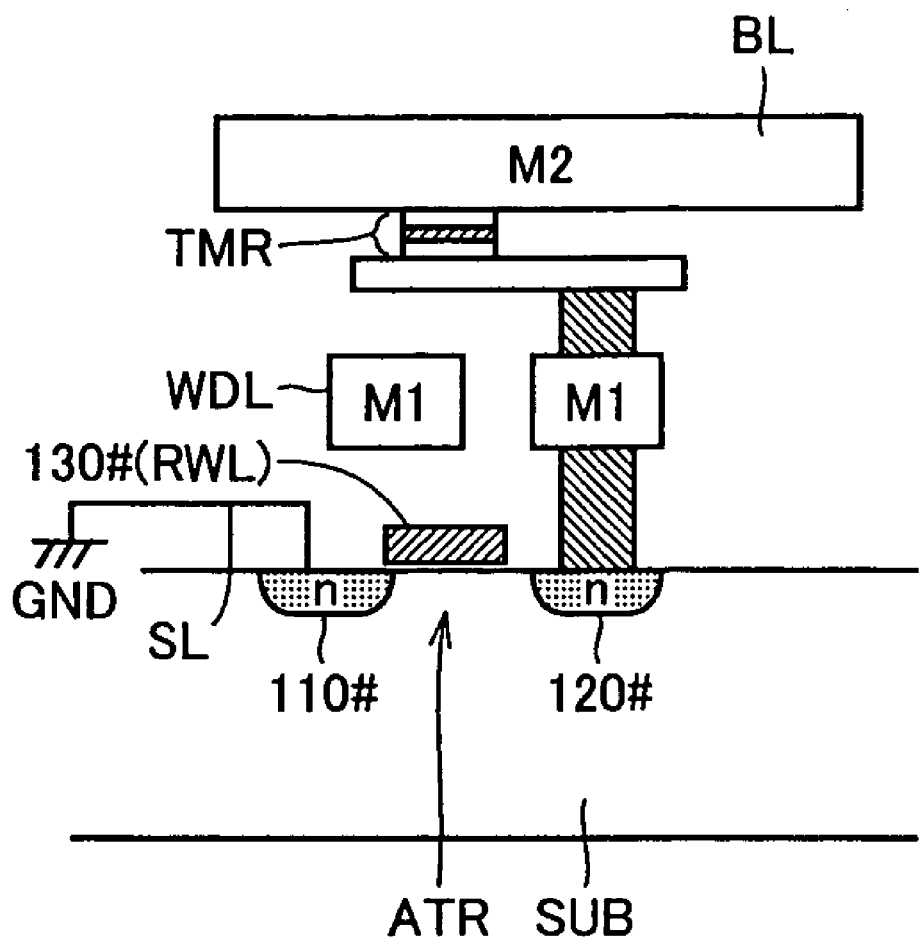
FIG. 9 is a cross sectional view of the MTJ memory cell structure corresponding to FIG. 8.

FIG. 9 is a cross sectional view of the MTJ memory cell structure in the case where write digit line WDL is provided at the lowermost interconnection layer.

Referring to FIG. 9, MTJ memory cell MC is formed of tunneling magneto-resistance element TMR and access transistor ATR. Access transistor ATR has impurity regions 110#, 120# and a gate 130#. Impurity region 110# is electrically coupled to ground voltage GND by source voltage line SL shown in FIG. 1, and serves as a source. Impurity region 120# is electrically coupled to tunneling magneto-resistance element TMR via an interconnection provided in a metal interconnection layer M1 and a contact formed in a via hole. Tunneling magneto-resistance element TMR is also electrically coupled to bit line BL provided in another metal interconnection layer M2.

Further, write digit line WDL is arranged in metal interconnection layer M1 in a region immediately below tunneling magneto-resistance element TMR. As such, write digit line WDL and bit line BL for making the data write magnetic field act on the tunneling magneto-resistance element are formed in metal interconnection layers M1 and M2, respectively, that are arranged in the vicinity of tunneling magneto-resistance element TMR to sandwich the same therebetween.

At the time of data read, access transistor ATR turns on in response to activation of a read word line RWL placed at gate region 130#. Thus, a current path is formed from bit line BL, via tunneling magneto-resistance element TMR, impurity region (drain) 120#, impurity region (source) 110# to ground voltage GND, through which a current in accordance with the electric resistance of the tunneling magneto-resistance element, i.e., the stored data in the MTJ memory cell, can be passed.

Referring again to FIG. 8, in the fourth configuration example, the data write current Ip path is designed not to extend across a plurality of interconnection layers, so that the electric resistance of data write current Ip path formed between power supply pad 150 and ground voltage GND is reduced. That is, the electric resistance of the relevant path becomes smaller than in the case where a data write current Ip path is formed through a plurality of interconnections formed in respective interconnection layers and a contact coupling the interconnection layers. Accordingly, a prescribed data write current is readily acquired even if power supply voltage Vcc2 is set relatively low.

In particular, in the MRAM device, either one of bit line BL and write digit line WDL requires a relatively large current amount to be passed therethrough, and thus, bit line BL or write digit line WDL is provided at the lowermost interconnection layer. Which should be formed at the lowermost layer, bit line BL or write digit line WDL, may be determined based on set values of the data write currents passing through the respective interconnections.

That is, the structure of the MTJ memory cell shown in FIG. 9 corresponds to the case where data write current Ip flowing through write digit line WDL is greater than data write current ±Iw flowing through bit line BL.

Modification of First Embodiment

In the first embodiment, the configuration for supplying a data write current to write digit line WDL has been described. In the modification of the first embodiment, the same configuration is applied to a data write current supplying configuration with respect to bit line BL.

Figure 10:
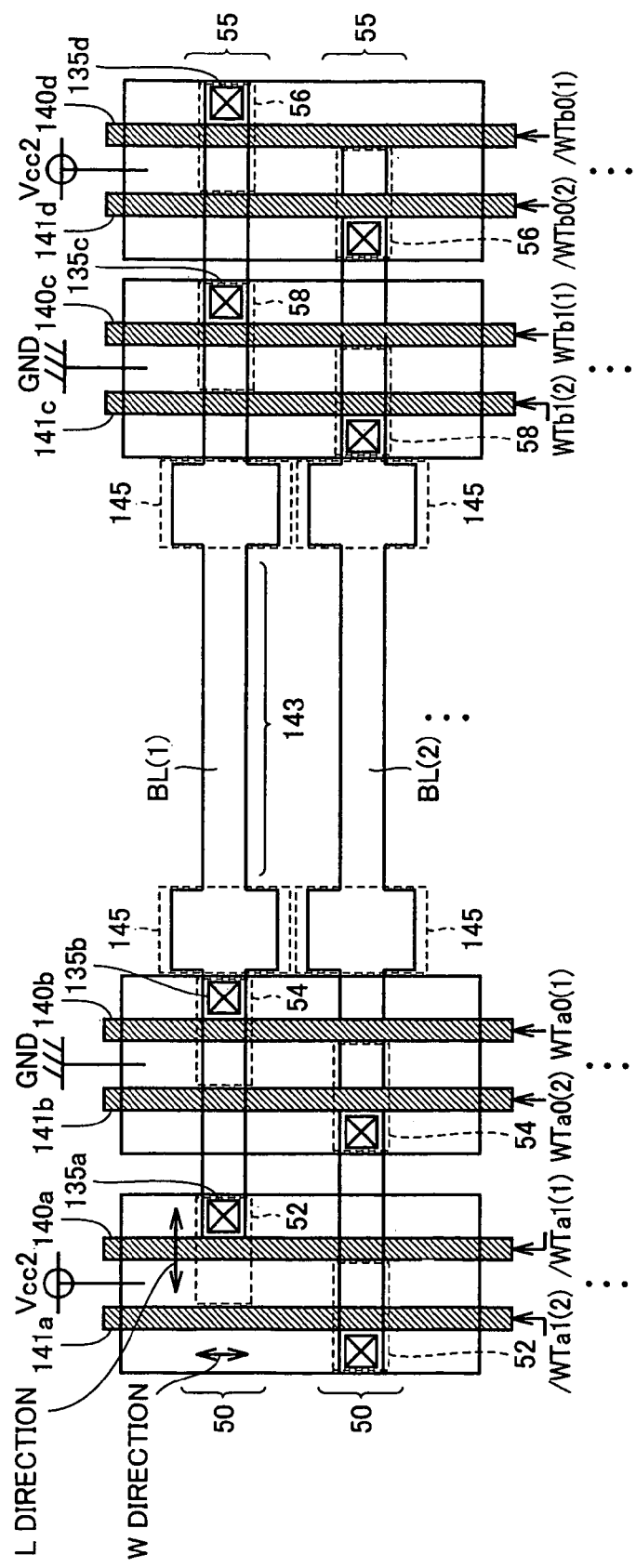
FIGS. 10 and 11 are conceptual diagrams showing first and second configuration examples of the data write current supplying circuitry with respect to bit lines according to a modification of the first embodiment.

FIG. 10 is a conceptual diagram showing a first configuration example of the data write current supplying circuitry for bit line BL according to the modification of the first embodiment. Although a two-dimensional layout of bit lines BL(1) and BL(2) in the first and second columns and the data write current supplying configuration corresponding thereto has been shown in FIG. 10, the identical configuration is provided for the other bit line BL.

Referring to FIG. 10, bit line drivers 50 and 55 are arranged on the respective ends of each bit line BL, as described in conjunction with FIG. 1. Hereinafter, the layout configuration of the bit line drivers corresponding to bit line BL(1) in the first column is described representatively.

Referring to FIG. 10, of the driver transistors constituting the bit line driver 50, driver transistor 52 being a P-MOS transistor has its source directly coupled to power supply voltage Vcc2, and its drain connected to one end (on the bit line driver 50 side) of bit line BL(1) via a contact 135a. The gate of driver transistor 52 is connected to a gate interconnection 140a, on which a write control signal/WTa1(1) corresponding to bit line BL(1) is transmitted.

On the other hand, driver transistor 54 being an-N-MOS transistor has its source directly coupled to ground voltage GND and its drain connected to the one end of bit line BL(1) via a contact 135b. The gate of driver transistor 54 is connected to a gate interconnection 140b. A write control signal WTa0(1) corresponding to bit line BL(1) is transmitted on gate interconnection 140b.

Similarly, of the driver transistors constituting the bit line driver 55, driver transistor 56 being a P-MOS transistor has its source directly coupled to power supply voltage Vcc2, and its drain connected to the other end (on the bit line driver 55 side) of bit line BL(1) via a contact 135d. The gate of driver transistor 56 is connected to a gate interconnection 140d. A write control signal/WTb0(1) corresponding to bit line BL(1) is transmitted on gate interconnection 140d.

On the other hand, driver transistor 58 being an N-MOS transistor has its source directly coupled to ground voltage GND and its drain connected to the other end of bit line BL(1) via a contact 135c. The gate of driver transistor 58 is connected to gate interconnection 140c, on which a write control signal WTb1(1) corresponding to bit line BL(1) is transmitted.

Each of driver transistors 52, 54, 56, 58 is arranged such that its gate length extends in the same direction as the arranged direction of bit line BL(1), as in the case of driver transistors 35 in the first embodiment.

Thus, the driver transistor group constituting bit line drivers 50, 55 can be arranged efficiently, without adversely affecting the layout pitch of bit lines BL, compared to the case where the gate length direction is made to cross (perpendicular to) the arranged direction of the bit lines.

Further, bit line BL(1) has, between an ordinary portion 143 corresponding to a region where MTJ memory cells are arranged and contacts 135a, 135c, reinforced portions 145 each designed to have an interconnection cross sectional area greater than that of ordinary portion 143. The data write current flowing through bit line BL changes in accordance with the level of written data. It means that both the one end and the other end of bit line BL may be coupled to power supply voltage Vcc2. As already described, reinforced portion 145 having greater interconnection cross sectional area needs to be provided on the power supply voltage Vcc2 side to which electrons flow in during supply of the data write current. Thus, it is necessary to provide reinforced portions 145 corresponding to the both ends of bit line BL.

With such a configuration, the same effects as in the first embodiment can be enjoyed for bit line BL. Electromigration due to a local increase of current density is prevented from occurring, and thus, operational reliability improves.

Figure 11:
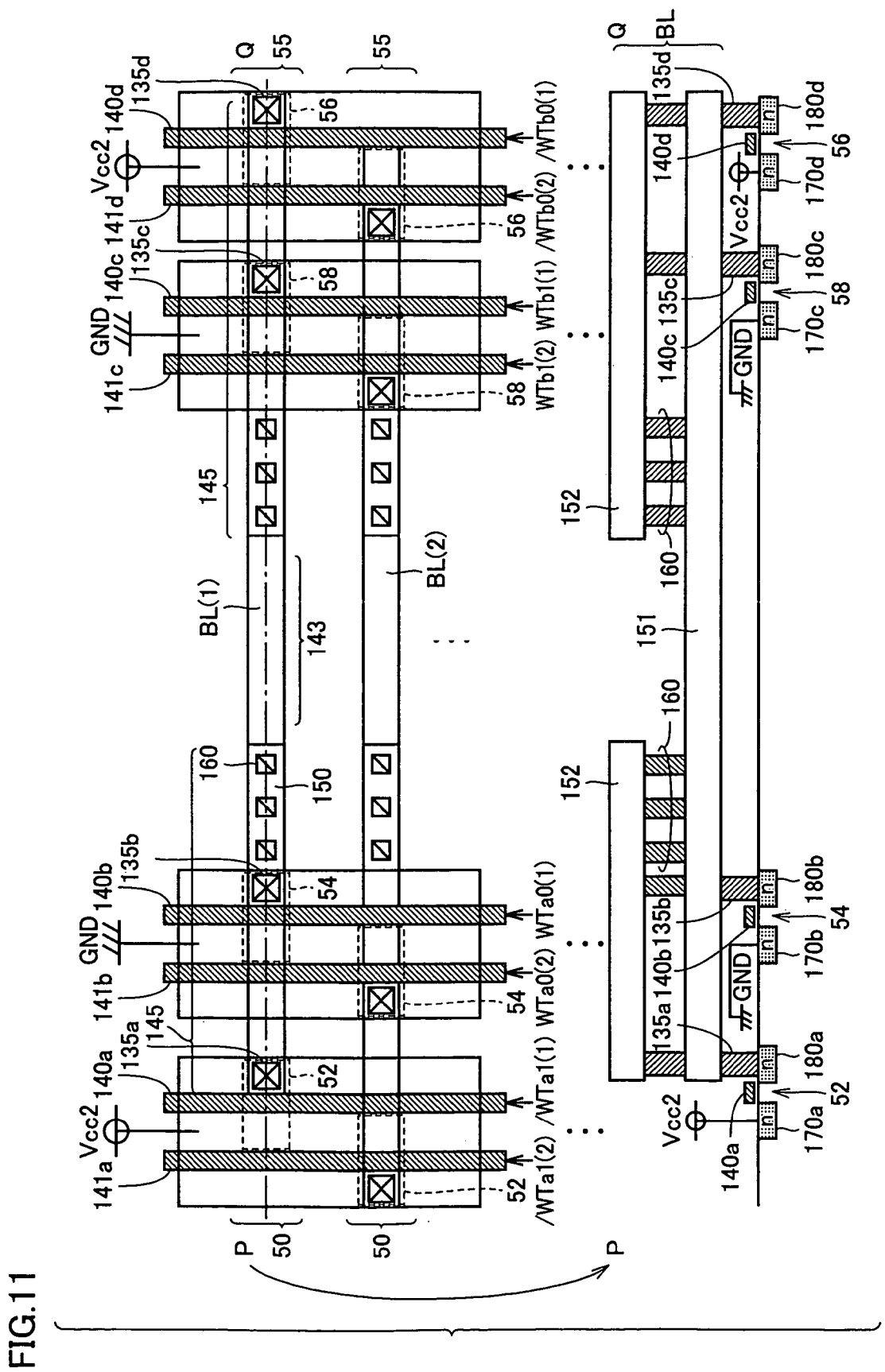

Referring to FIG. 11, in a second configuration example of the modification of the second embodiment, the arrangement of write digit line WDL shown in FIG. 6 is applied to bit line BL. Bit line BL is configured with interconnections 151 and 152 formed in different interconnection layers. Interconnection 151 corresponds to bit line BL in the ordinary portion shown, e.g., in the structural diagram of FIG. 9, which is arranged in the vicinity of tunneling magneto-resistance element TMR.

Interconnection 152 is arranged in an upper layer of interconnection 151, and electrically coupled to interconnection 151 via a contact 160 provided in a via hole.

Driver transistor 52 has impurity regions 170a, 180a and a gate connected to a gate interconnection 140a. Impurity region 170a, electrically coupled to power supply voltage Vcc2, serves as a source. Impurity region 180a, connected to interconnections 151, 152 via a contact 135a, serves as a drain.

Similarly, driver transistor 54 has impurity regions 170b, 180b and a gate connected to a gate interconnection 140b. Impurity region 170b, electrically coupled to ground voltage GND, serves as a source. Impurity region 180b, connected to interconnections 151, 152 via a contact 135b, serves as a drain.

Further, driver transistor 56 has impurity regions 170d, 180d and a gate connected to a gate interconnection 140d. Impurity region 170d electrically coupled to power supply voltage Vcc2 serves as a source. Impurity region 180d connected to interconnections 151, 152 via a contact 135d serves as a drain.

Driver transistor 58 has impurity regions 170c, 180c and a gate connected to a gate interconnection 140c. Impurity region 170c electrically coupled to ground voltage GND serves as a source. Impurity region 180c connected to interconnections 151, 152 via a contact 135c serves as a drain.

With such a configuration, as in the configuration shown in FIG. 10, the cross sectional area (interconnection cross sectional area) through which the data write current passes increases equivalently at each end of bit line BL. As a result, even if the interconnection width of the bit line decreases at each end, it will not cause a local increase of current density, so that occurrence of electromigration can be prevented.

In particular, in the configuration example shown in FIG. 11, interconnections 151 and 152 can be designed in the uniform shape, which facilitates manufacture of the interconnections compared to the configuration example of FIG. 10. Further, it is devoid of widening in two dimensions, so that it can be applied to the case with a layout pitch corresponding to the minimum feature length.

Second Embodiment

In the second embodiment, desirable arrangement of the bit line drivers described in the first embodiment will be explained in more detail.

Figure 12:
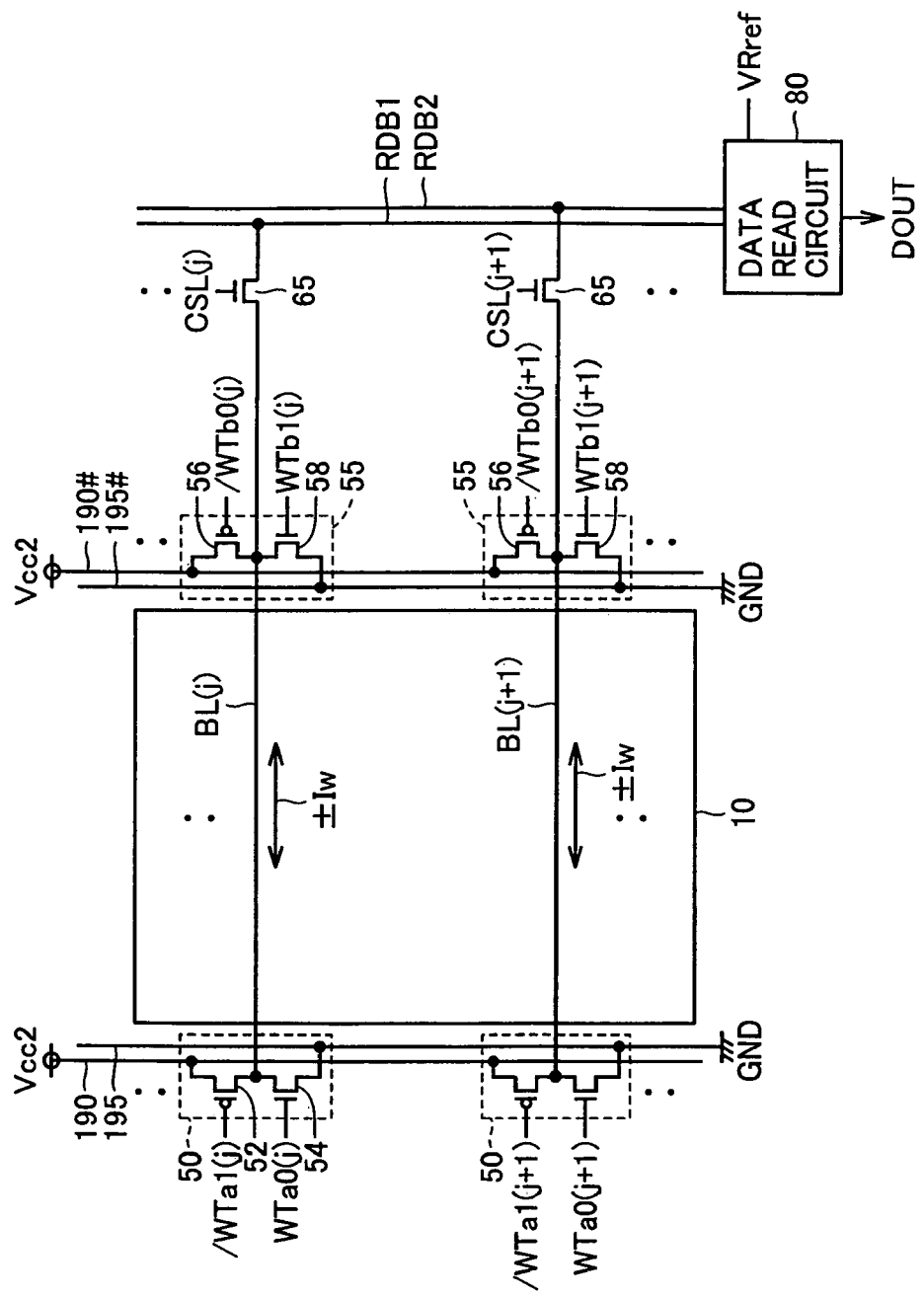
FIGS. 12–14 show first through third arrangement examples of bit line drivers according to a second embodiment of the present invention.

FIG. 12 shows a first arrangement example of the bit line drivers according to the second embodiment. Although bit lines BL(j) and BL(j+1) in the j-th and (j+1)-th columns and the configuration corresponding thereto are shown representatively in FIG. 12, the same configuration is provided for the other bit line BL. The j-th and (j+1)-th columns are representatives of odd and even columns, respectively.

Referring to FIG. 12, a set of power supply interconnection and ground interconnection extending in a direction crossing bit line BL is arranged corresponding to each end of bit line BL, in a region adjacent to memory cell array 10. Specifically, power supply interconnection 190 supplying power supply voltage Vcc2 is connected to driver transistor 52 within bit line driver 50, and ground interconnection 195 supplying ground voltage GND is connected to driver transistor 54 within bit line driver 50.

Similarly, power supply interconnection 190# supplying power supply voltage Vcc2 is connected to driver transistor 56 within bit line driver 55, and ground interconnection 195# supplying ground voltage GND is connected to driver transistor 58 within bit line driver 55.

As already described, read select gate 65 for transmitting read data from a selected memory cell at the time of data read is arranged corresponding to each bit line BL. Every other bit lines BL are connected to either of read data buses RDB1 and RDB2. For example, bit line BL(j) in the odd column is connected to read data bus RDB 1 via read select gate 65, while bit line BL(j+1) in the even column is connected to read data bus RDB2 via read select gate 65.

Each read select gate 65 has its gate connected to column select line CSL transmitting a selection result of a corresponding memory cell column at the time of data read. Activation/inactivation of column select line CSL is as described in conjunction with FIG. 1.

Further, although not shown, read word lines RWL shown in FIG. 1 are arranged corresponding to respective memory cell columns. At the time of data read, a selected memory cell is connected to bit line BL of the selected column.

As a result, data read circuit 80 can decide read data DOUT from the selected memory cell based on the comparison between a voltage of read data bus RDB1 or RDB2 connected to the selected memory cell via read select gate 65 and a read reference voltage VRref.

Here, read select gate 65 is arranged more outward from memory cell array 10 than bit line driver 50 or 55. With such a configuration, the current path of the data write current flowing through bit line BL becomes short, so that its electric resistance decreases. As a result, it is readily possible to assure data write current ±Iw of a prescribed level flowing through the bit line.

Figure 13:
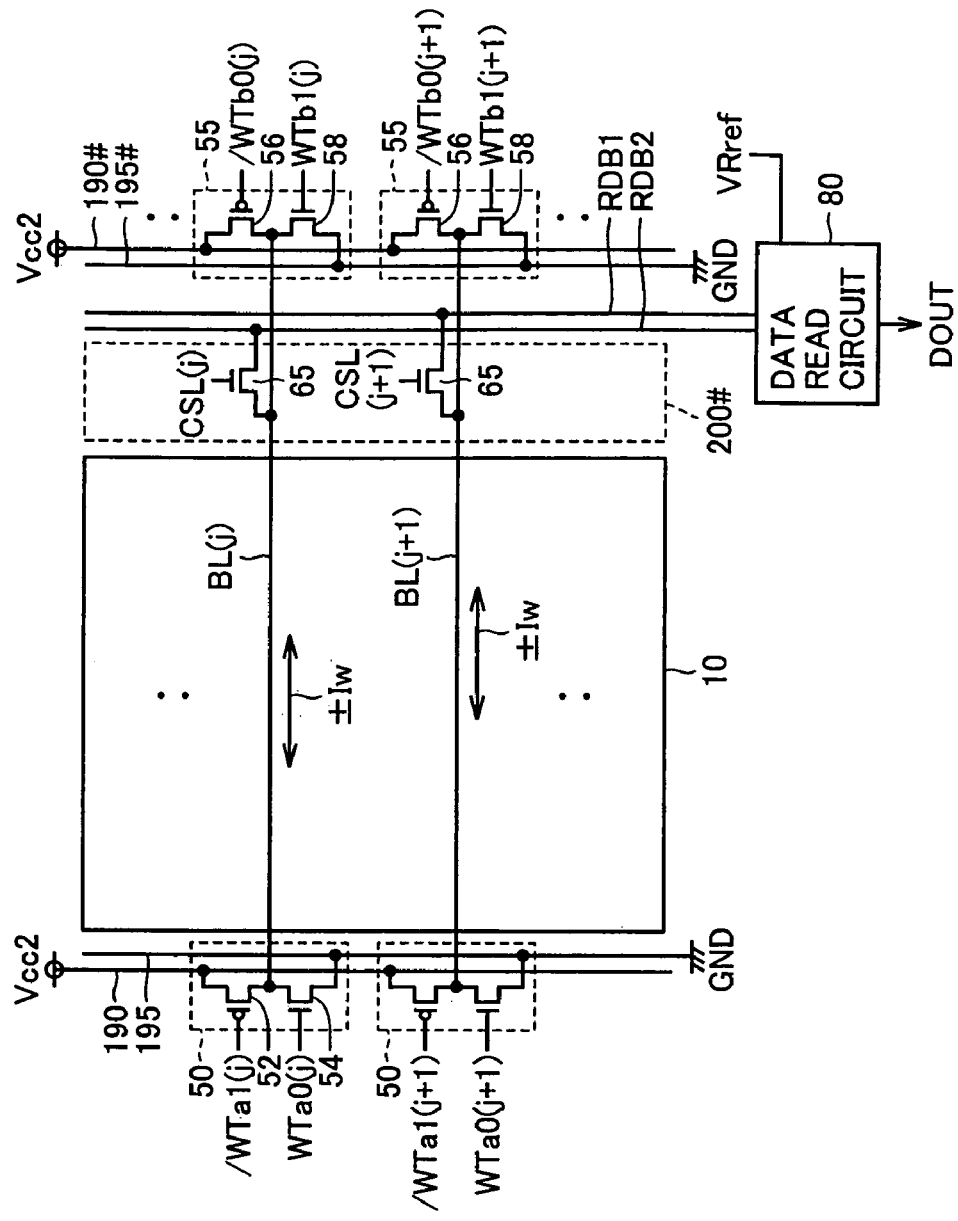

Referring to FIG. 13, a second configuration example according to the second embodiment differs from the first configuration example shown in FIG. 12 in that read select gate 65 is arranged between bit line driver 50 (or 55) and memory cell array 10. In the second configuration example, read select gate 65 is arranged in a region 200# (or 200) located between the set of power supply interconnection 190# and ground interconnection 195# (or the set of power supply interconnection 190 and ground interconnection 195) and memory cell array 10. Otherwise, the configuration and arrangement of the second example are the same as those of the first example shown in FIG. 12, so that detailed description thereof is not repeated.

With such a configuration, power supply interconnection 190# and ground interconnection 195# included in the current path of data write current ±Iw at the time of data write can be kept at a distance from memory cell array 10. Accordingly, it is possible to alleviate the adverse effect of magnetic noise generated by power supply interconnection 190# and ground interconnection 195# on memory cell array 10.

Further, since read select gate 65 is arranged in the vicinity of memory cell array 10, the electric resistance of the data read current path at the time of data read is reduced. This permits a rapid data read operation.

In the configuration examples shown in FIGS. 12 and 13, bit lines in the odd columns and the even columns are connected to different read data buses RDB1 and RDB2. Alternatively, every bit line BL may be connected to a common read data bus, or three or more read data buses may be provided each for a respective group of bit lines BL. In such configurations, the bit line drivers and the read select gates may be arranged in the same manner as described above.

Figure 14:
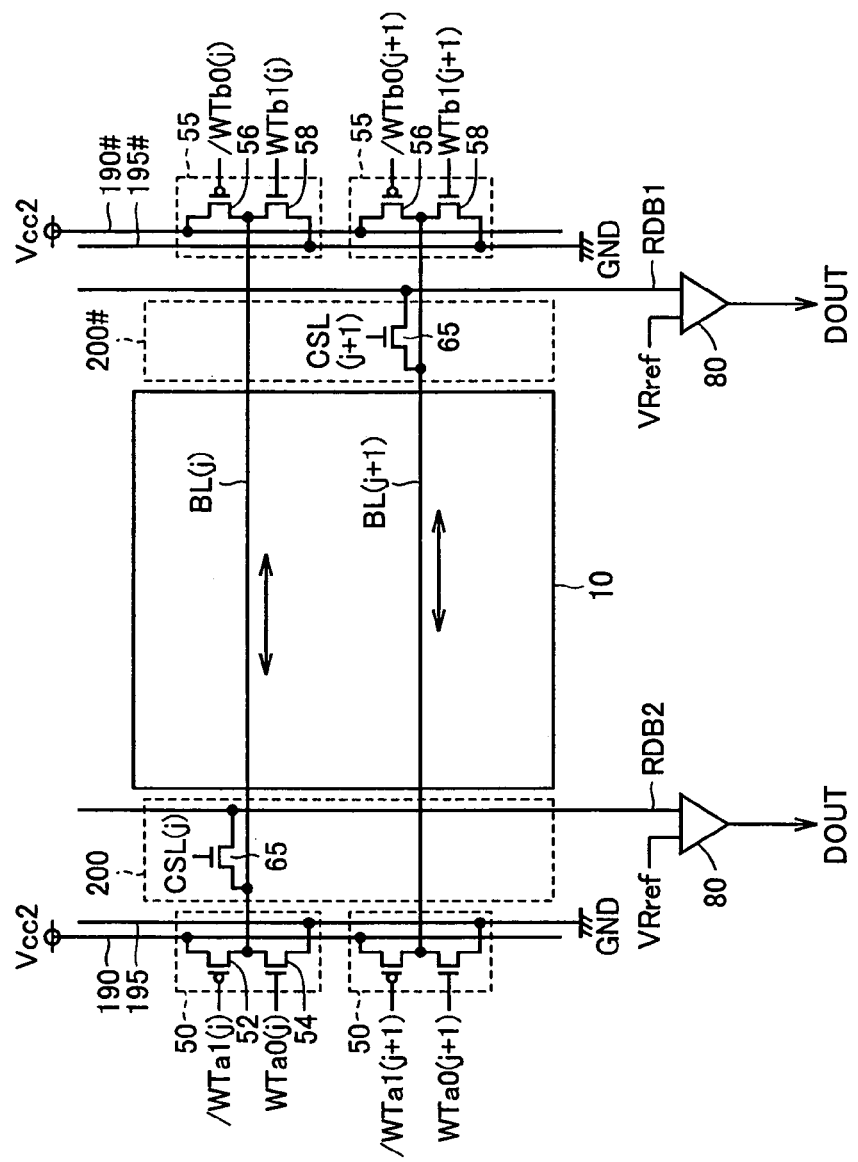

FIG. 14 shows a third arrangement example of the bit line drivers according to the second embodiment.

Referring to FIG. 14, the third configuration example differs from the second configuration example shown in FIG. 13 in that read data buses RDB1 and RDB2 are arranged in separate regions located on respective sides of memory cell array 10. As such, data read circuits 80 are arranged corresponding to respective read data buses RDB 1 and RDB2. Read select gate 65 is arranged in a region 200 between the set of power supply interconnection 190 and ground interconnection 195 and memory cell array 10 in an odd column, and is arranged in a region 200# between the set of power supply interconnection 190# and ground interconnection 195# and memory cell array 10 in an even column. Otherwise, the third configuration example is the same as the second configuration example shown in FIG. 13, and thus, detailed description thereof is not repeated.

With such a configuration, the adverse effect of magnetic noise from power supply interconnections 190, 190# and ground interconnections 195, 195# acting on memory cell array 10 at the time of data write is alleviated. Accordingly, malfunction in data write can be suppressed, and a stable operation is ensured.

Figure 15:
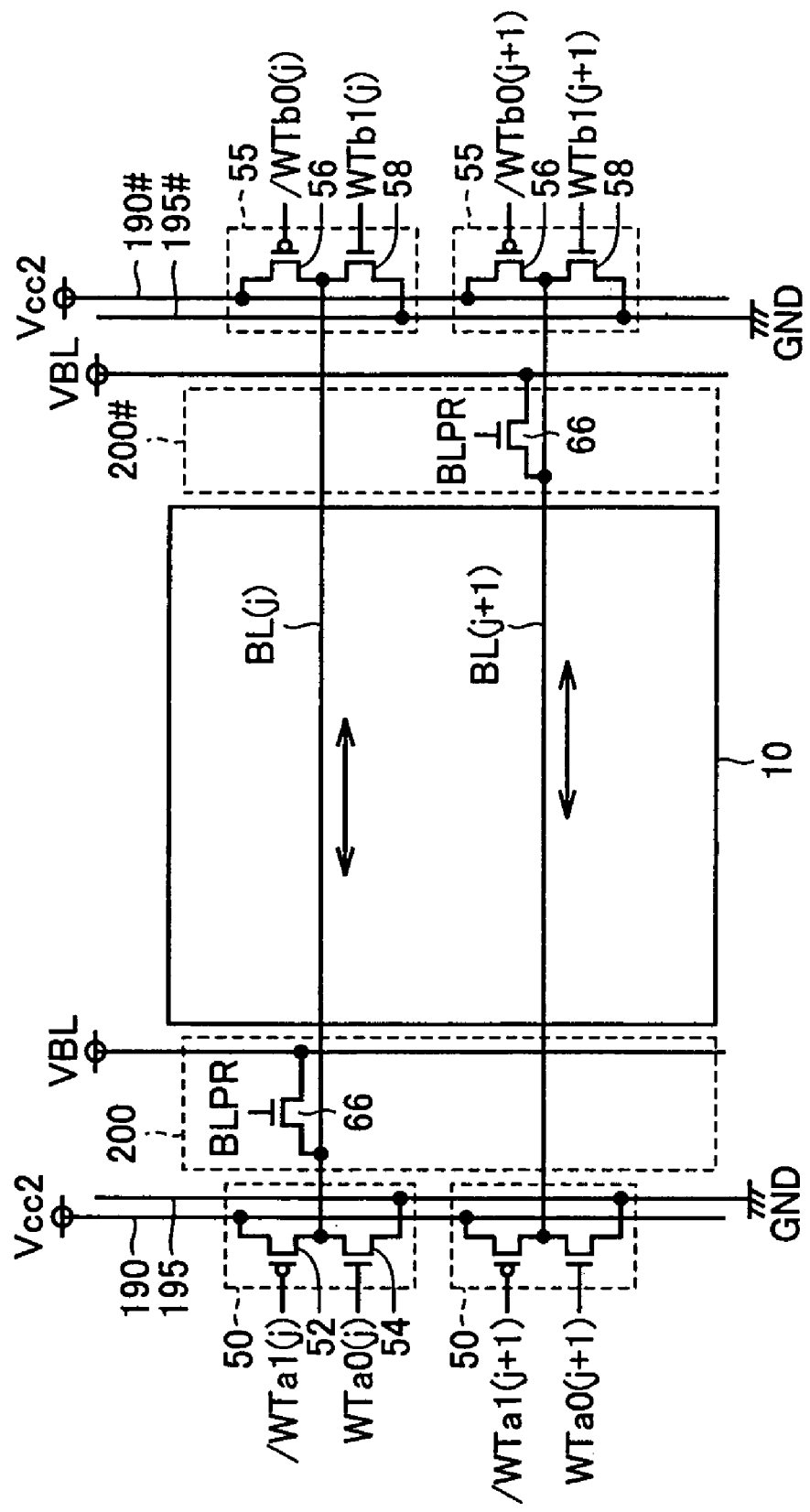
FIGS. 15 and 16 show variations of the third arrangement example of the bit line drivers shown in FIG. 14.
Figure 16:
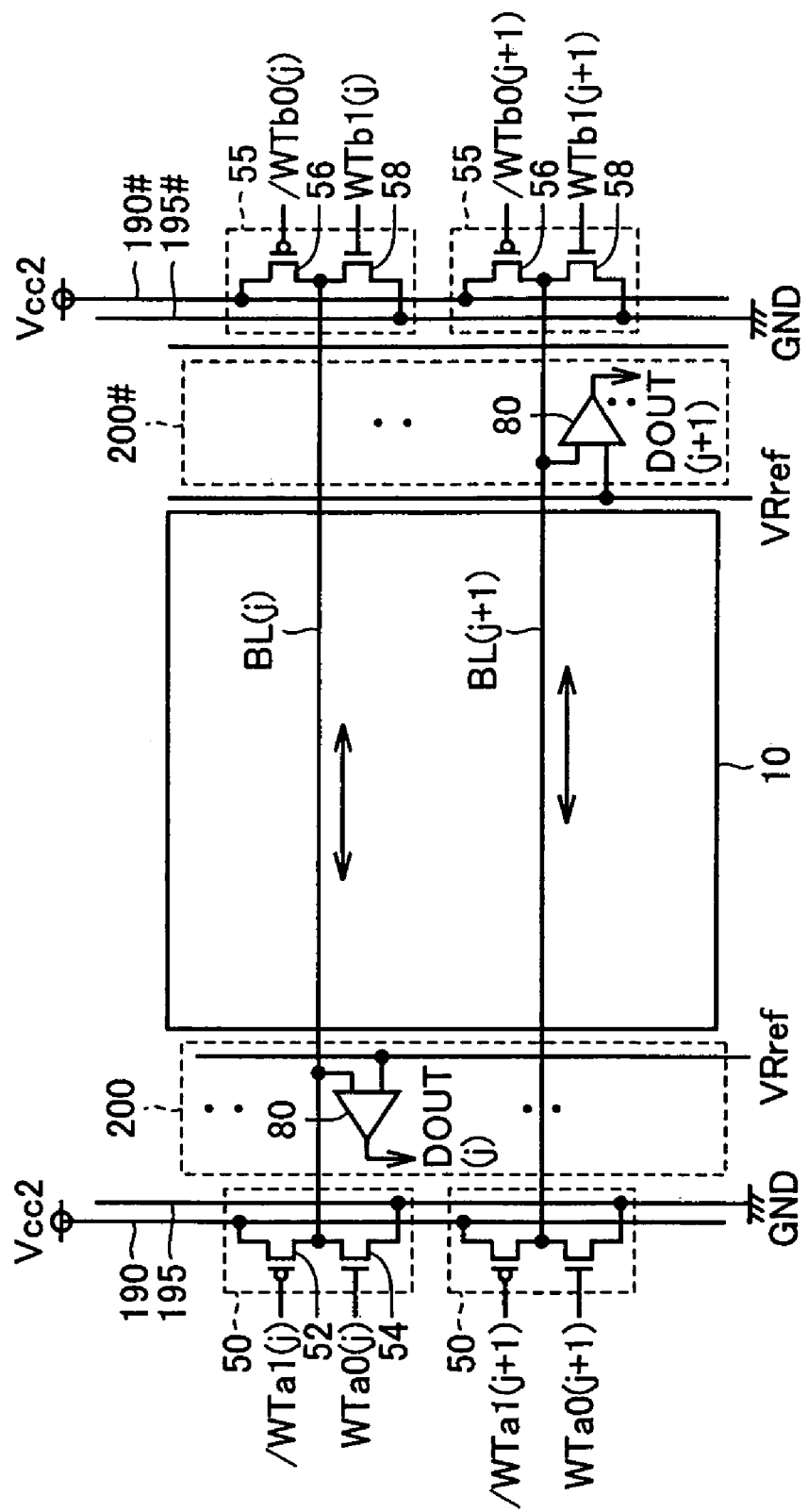

FIGS. 15 and 16 show variations of the third configuration example shown in FIG. 14.

For example, in FIG. 15, regions 200 and 200# shown in FIG. 10 are utilized to arrange a precharge transistor 66 for precharging bit line BL to a prescribed voltage. Precharge transistor 66 is formed of, e.g., an N-MOS transistor. It responds to activation of a control signal BLPR activated (to an H level) during a bit line precharge period, and connects corresponding bit line BL to a prescribed bit line precharge voltage VBL.

Although arrangement of precharge transistors 66 corresponding to bit lines BL(j) and BL(j+1) has been shown representatively in FIG. 15, precharge transistor 66 is arranged for the other bit line BL (not shown) in the same manner.

With such a configuration, the magnetic noise generated by power supply interconnections 190, 190# and ground interconnections 195, 195# and acting on memory cell array 10 can be alleviated, as in the third configuration example shown in FIG. 14.

Alternatively, in the case where data read circuits 80 are arranged corresponding to respective bit lines BL to implement parallel data read in a plurality of bit lines, data read circuits 80 may be arranged in regions 200, 200#, as shown in FIG. 16. Although bit lines BL(j) and BL(j+1) and data read circuits 80 corresponding thereto are shown representatively in FIG. 16, data read circuit 80 is also arranged for the other bit line BL (not shown) utilizing region 200 or 200#.

With such a configuration, again, power supply interconnections 190, 190# and ground-interconnections 195, 195# can be kept far from memory cell array 10, so that the magnetic noise generated from power supply interconnections 190, 190# and ground interconnections 195, 195# and acting on memory cell array 10 at the time of data write, can be alleviated.

The configurations shown in FIGS. 13–15 are applicable to the case where three or more read data buses are divided into two groups and arranged on the respective sides of the memory cell array.

First Modification of Second Embodiment

In the first modification of the second embodiment, a configuration for alleviating magnetic noise from power supply interconnection and ground interconnection with respect to the write digit line drive circuit is described.

Figure 17:
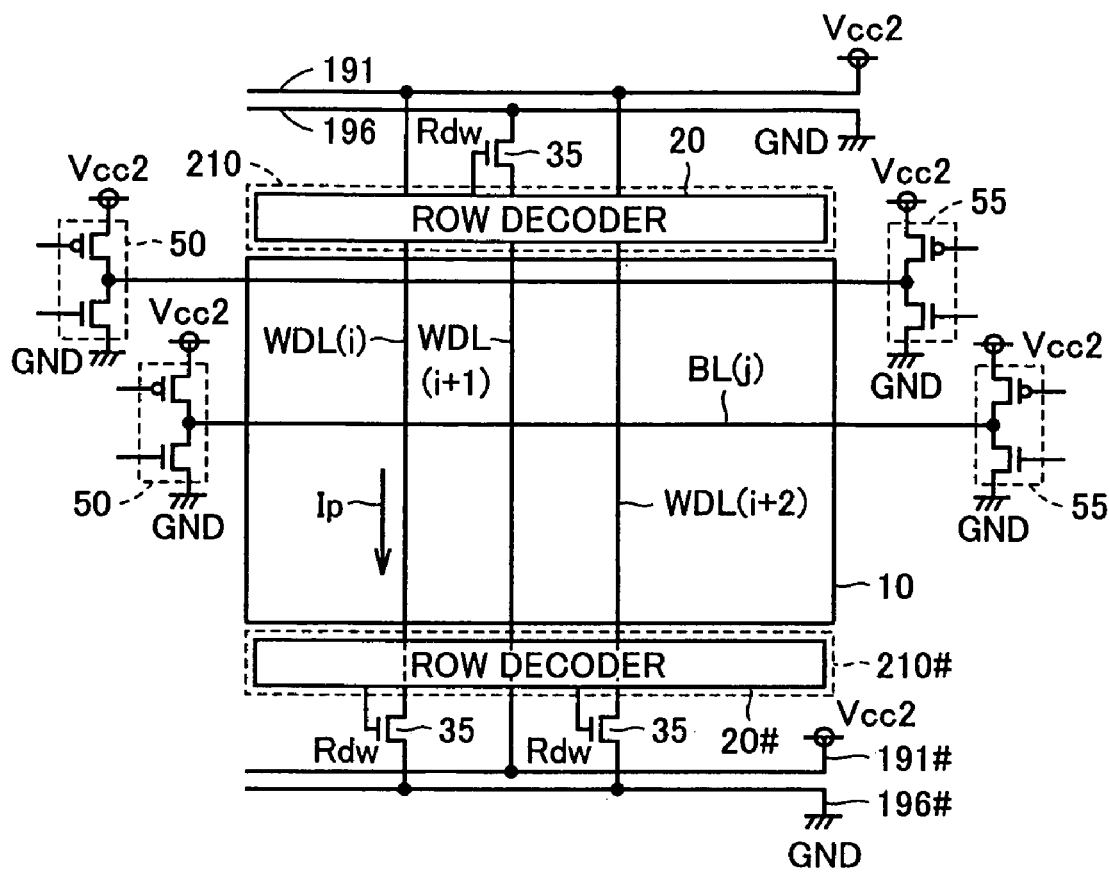
FIG. 17 shows a first arrangement example of the write digit line drive circuit according to a first modification of the second embodiment.

FIG. 17 shows a first arrangement example of the write digit line drive circuit according to the first modification of the second embodiment. Although the configuration corresponding to the i-th row (i is a natural number) and the (i+2)-th row as representatives of even rows and the (i+1)-th row as a representative of odd rows is shown representatively in FIG. 17, the identical configuration is provided for the other memory cell row.

Referring to FIG. 17, driver transistors 35 constituting the write digit line drive circuit are each arranged on either side of memory cell array 10 alternately for every other row, as shown in FIG. 7. For example, one of regions located on respective sides of memory cell array 10 adjacent thereto is used to arrange power supply interconnection 191 and ground interconnection 196 in a direction crossing write digit line WDL, and the other of the regions adjacent to memory cell array 10 is used to arrange power supply interconnection 191# and ground interconnection 196# in a direction crossing write digit line WDL. Power supply interconnections 191, 191# transmit power supply voltage Vcc2, and ground interconnections 196, 196# transmit ground voltage GND. As already described, bit line drivers 50 and 55 are arranged corresponding to respective ends of each bit line BL.

One end (on the upper side of FIG. 17) of write digit line WDL in an even row is connected to power supply interconnection 191, and the other end (on the lower side of FIG. 17) thereof is connected to ground interconnection 196# via driver transistor 35. Similarly, one end of write digit line WDL in an odd row is connected to ground interconnection 196 via driver transistor 35, and the other end thereof is connected to power supply interconnection 191#.

Further, regions 210 and 210# located between driver transistors 35 and memory cell array 10 are used to arrange row decoders 20 and 20#, respectively. Row decoder 20 outputs row decode signals Rdw corresponding to the odd rows, and row decoder 20# outputs row decode signals Rdw corresponding to the even rows.

With such a configuration, it is not only possible to efficiently arrange driver transistors 35 and row decoders 20, 20#i but also possible to keep power supply interconnections 191, 191# and ground interconnections 196, 196# for supplying data write currents on write digit lines WDL, far from memory cell array 10. Thus, the magnetic noise generated from the power supply interconnections and the ground interconnections during supply of data write current Ip at the time of data write and acting on the memory cell array, can be alleviated.

Figure 18:
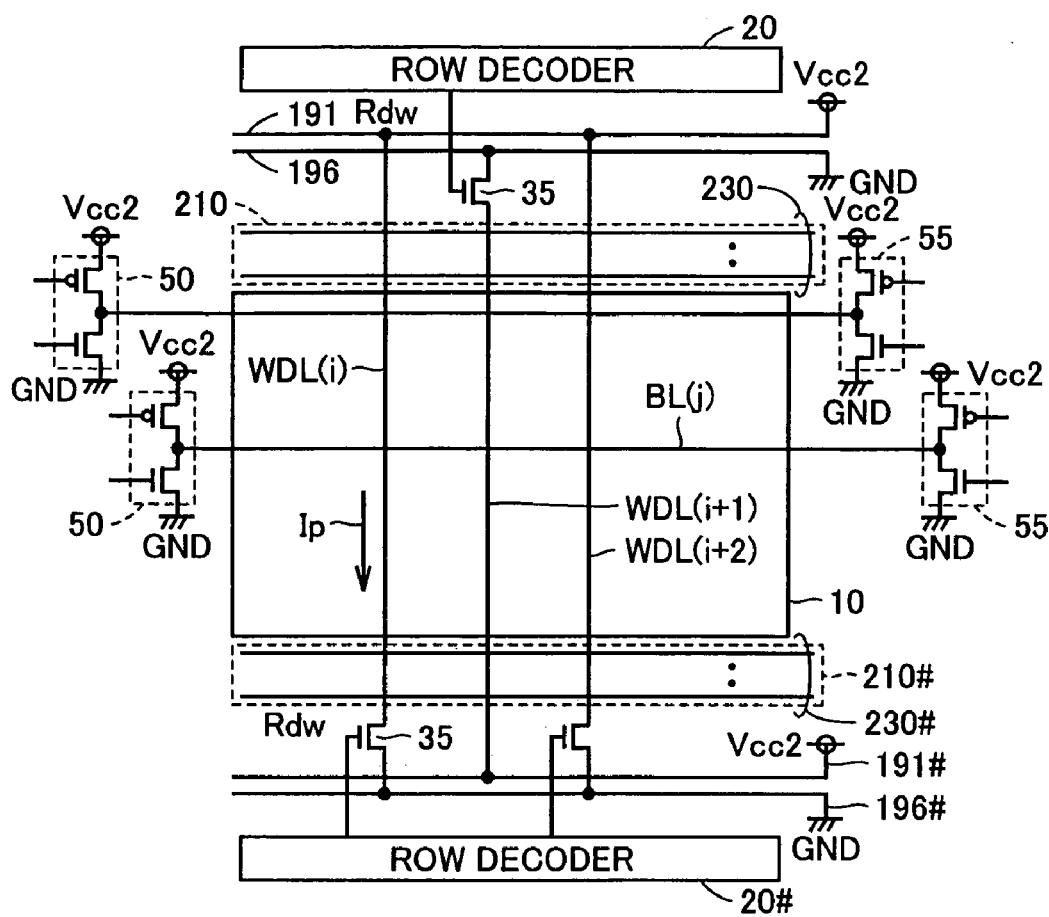
FIG. 18 shows a variation in arrangement of the bit line driver shown in FIG. 17.

Alternatively, regions 210 and 210# may be used to arrange interconnection groups 230 and 230# for transmitting address signals and other signals, as shown in FIG. 18. In this case, row decoders 20 and 20# may be arranged in regions located more outward from memory cell array 10 than driver transistors 35.

With such a configuration, again, the magnetic noise from the power supply interconnections and the ground interconnections acting on memory cell array 10 at the time of supply of data write current on write digit line WDL can be alleviated, as in the configuration example shown in FIG. 17.

Second Modification of Second Embodiment

Figure 19:
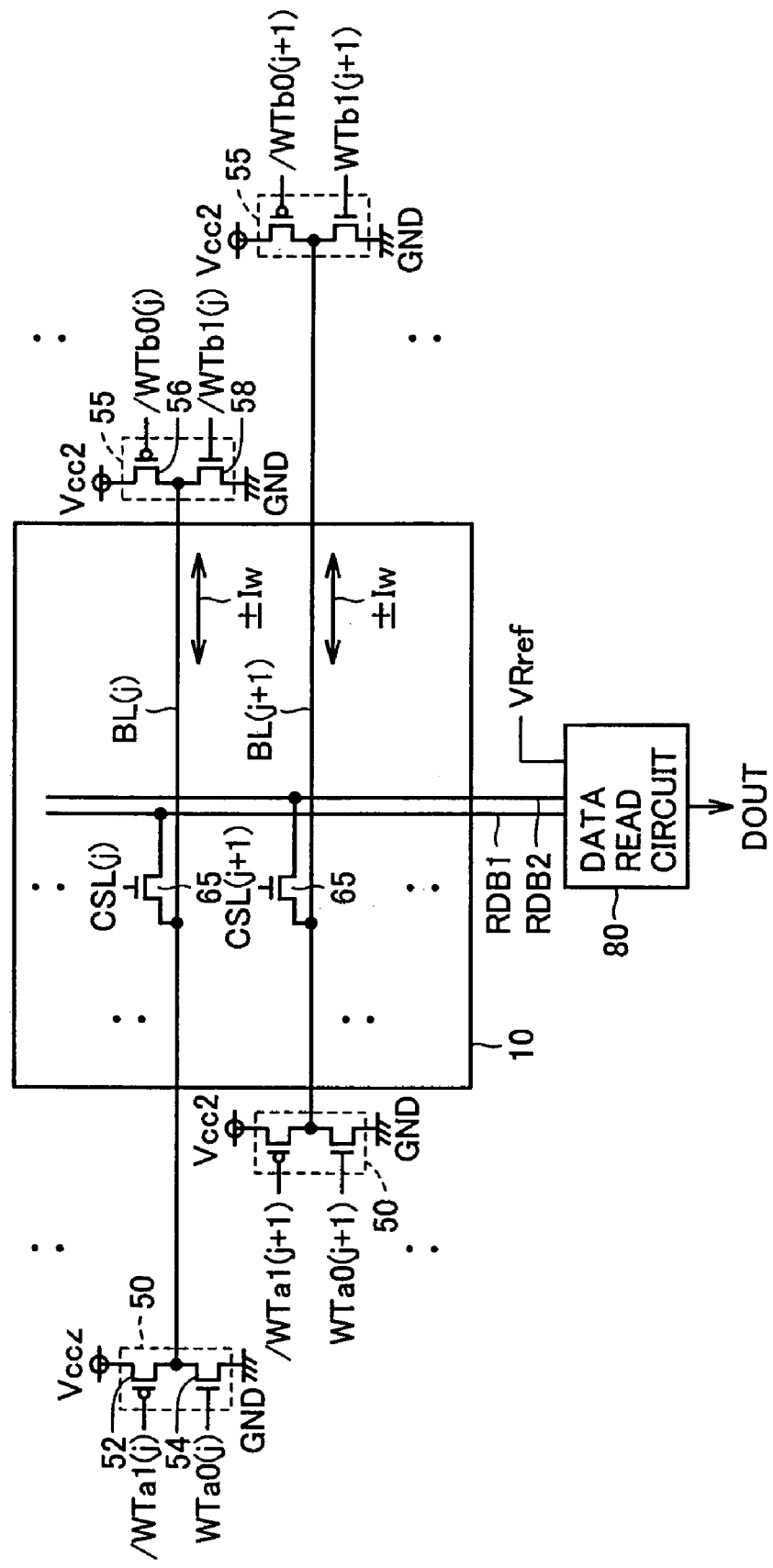
FIGS. 19 and 20 are conceptual diagrams showing arrangements of read select gates according to second and third modifications, respectively, of the second embodiment.

Referring to FIG. 19, the second modification of the second embodiment differs from the arrangement example shown in FIG. 13 in that read data buses RDB1, RDB2 provided in a direction crossing each bit line BL are arranged corresponding to an intermediate portion of bit line BL. As a result, read select gate 65 is arranged between an intermediate node of each bit line BL and read data bus RDB1 or RDB2. Data read circuit 80 is provided in a peripheral region of memory cell array 10 corresponding to read data buses RDB1 and RDB2. Otherwise, the configuration of the second modification is the same as in FIG. 13, and thus, detailed description thereof is not repeated.

With such a configuration, bit line BL is divided into two portions with the intermediate node connected to read select gate 65 as the boundary. At the time of data read, the data read current flows only in one of the two portions that is coupled to a selected memory cell.

As a result, it is possible to reduce the data read current path at the time of data read and hence electric resistance thereof. This permits a rapid data read operation.

Third Modification of Second Embodiment

Figure 20:
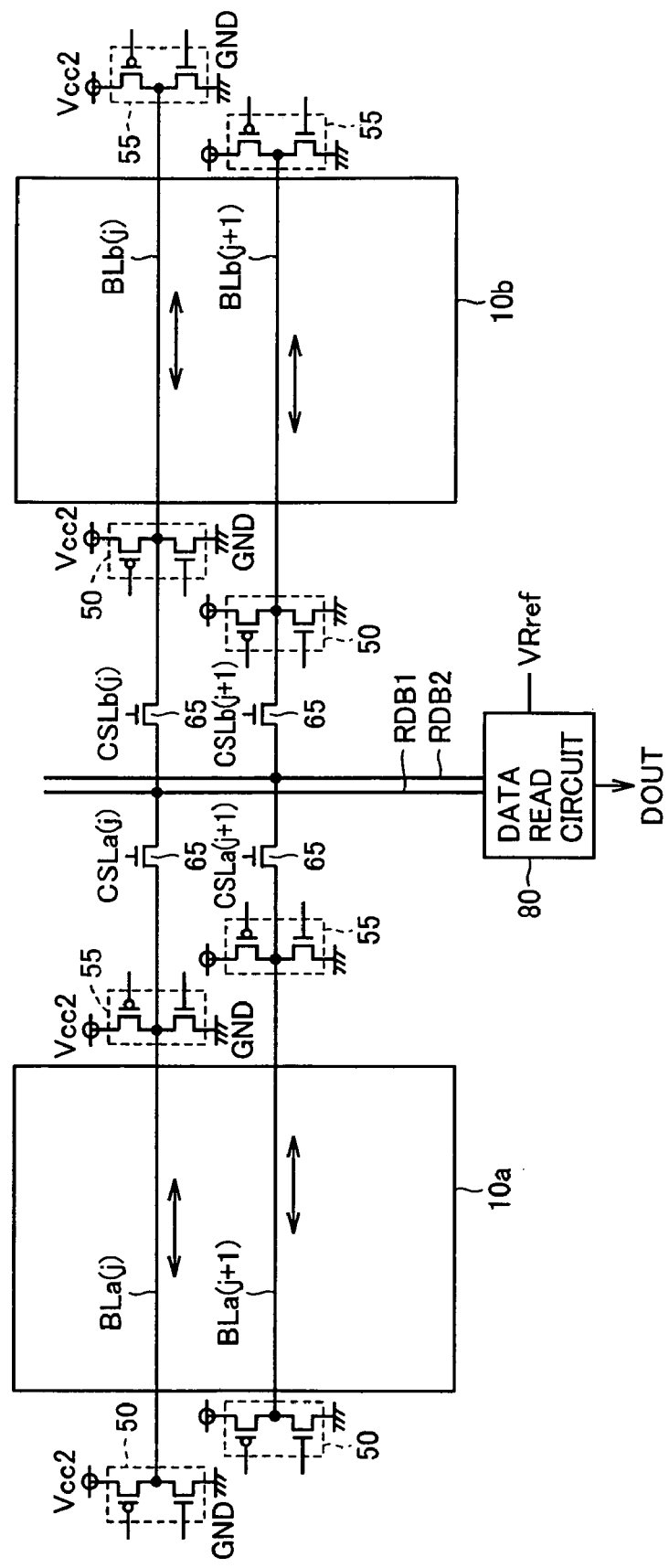

Referring to FIG. 20, in the third modification of the second embodiment, memory cell array 10 having a plurality of MTJ memory cells arranged therein is divided into two memory blocks 10a, 10b.

In each memory cell column, bit line BL is divided into two portions corresponding to memory blocks 10a and 10b. For example, bit line BL of the j-th column is divided into bit line BLa(j) arranged in memory block 10a and bit line BLb(j) arranged in memory block 10b. In each of memory blocks 10a, 10b, bit line drivers 50 and 55 are arranged corresponding to respective ends of each bit line. Hereinafter, the bit lines arranged in memory block 10a are represented collectively as bit line BLa, and the bit lines arranged in memory block 10b are represented collectively as bit line BLb.

Although not shown, in each of memory blocks 10a, 10b, read word lines RWL and write digit lines WDL are arranged for respective memory cell rows. Thus, a selected memory cell as a target of data read or data write is designated by a combination of selection of memory block 10a, 10b and row and column selection in each memory block.

Read data buses RDB1, RDB2 and data read circuit 80 are arranged at the boundary portion of memory blocks 10a and 10b to be shared by the memory blocks. In an odd column, read select gates 65 are provided between read data bus RDB1 and corresponding bit lines BLa and BLb, respectively. Similarly, in an even column, read select gates 65 are provided between read data bus RDB2 and corresponding bit lines BLa and BLb, respectively.

On/off of each read select gate 65 is controlled by a column select line CSLa or CSLb reflecting the select results of corresponding memory cell column and memory block. For example, in the j-th column, read select gate 65 corresponding to memory block 10a has its gate connected to column select line CSLa(j), and read select gate 65 corresponding to memory block 10b has its gate connected to column select line CSLb(j).

At the time of data read, column select line CSLa(j) is activated to an H level in the case where memory block 10a is selected and the j-th memory cell column is also selected, i.e., when a selected memory cell is connected to bit line BLa(j), and otherwise inactivated to an L level. Similarly, at the time of data read, column select line CSLb(j) is activated to an H level when memory block 10b and the j-th memory cell column are both selected, i.e., when a selected memory cell is connected to bit line BLb(j), and otherwise inactivated to an L level.

With such a configuration, in the array configuration divided into a plurality of memory blocks, the data read-related circuit group can be shared by the neighboring memory blocks 10a, 10b, so that a chip size can be reduced.

Although the present invention has been described and illustrated in detail, it is clearly understood that the same is by way of illustration and example only and is not to be taken by way of imitation, the spirit and scope of the present invention being limited only by the terms of the appended claims.

What is claimed is:

1. A thin film magnetic memory device, comprising:
    a memory cell array having a plurality of magnetic memory cells arranged therein, each magnetic memory cell having a magnetic layer magnetized in a direction in accordance with stored data;
    a plurality of bit lines each provided corresponding to respective one of prescribed sections of said plurality of magnetic memory cells;
    a plurality of first and second bit line drivers provided corresponding to respective ends of said plurality of bit lines to cause a data write current generating a data write magnetic field for magnetization of said magnetic layer to pass through at least one of said plurality of bit lines at the time of data write;
    a read data line provided along a direction crossing said plurality of bit lines for transmitting read data from selected one of said plurality of memory cells; and
    a read select gate for connecting one of said plurality of bit lines that is connected to said selected memory cell with said read data line at the time of data read;
    said read select gate being arranged more outward from said memory cell array than one of said plurality of first and second bit line drivers.

2. A thin film magnetic memory device, comprising:
    a memory cell array having a plurality of magnetic memory cells arranged therein, each magnetic memory cell having a magnetic layer magnetized in a direction in accordance with stored data;
    a plurality of data lines each provided corresponding to respective one of prescribed sections of said plurality of magnetic memory cells and passing therethrough a data write current for generating a data write magnetic field for magnetization of said magnetic layer at the time of data write;
    a plurality of current driving circuits provided corresponding to said plurality of data lines, respectively, each current driving circuit supplying said data write current to corresponding one of said plurality of data lines at the time of said data write; and
    a power supply interconnection provided between a prescribed voltage and said plurality of current driving circuits along a direction crossing said plurality of data lines; wherein
    at least one of circuit element and interconnection is arranged in an intermediate region between said power supply interconnection and said memory cell array.

3. The thin film magnetic memory device according to claim 2, wherein
    said data write magnetic field acts on said magnetic layer in a direction along an easy axis, and
    each of said plurality of current driving circuits includes first and second bit line drivers that are provided corresponding to respective ends of said corresponding data line for passing said data write current to said corresponding data line at the time of said data write in a direction in accordance with written data.

4. The thin film magnetic memory device according to claim 3, further comprising:
    a read data line provided in a direction crossing said plurality of data lines and transmitting read data; and
    a plurality of read select gates provided corresponding to said plurality of data lines, respectively, and connecting one of said plurality of data lines connected to selected one of said plurality of memory cells to said read data line at the time of data read;
    said read select gates being arranged in said intermediate region.

5. The thin film magnetic memory device according to claim 4, wherein
    said read data line is provided corresponding to respective one of both ends of said plurality of data lines, and
    said plurality of read select gates are each arranged corresponding to one of said both ends of said plurality of data lines alternately for every other said data line.

6. The thin film magnetic memory device according to claim 2, wherein
    said data write magnetic field acts on said magnetic layer in a direction along a hard axis,
    each of said plurality of current driving circuits includes, in said intermediate region, a write digit line driver provided corresponding to one of both ends of said corresponding data line, and
    said write digit line driver selectively passes said data write current in a prescribed direction to said corresponding data line at the time of said data write.

7. A thin film magnetic memory device, comprising:
    a memory cell array having a plurality of magnetic memory cells arranged therein, each magnetic memory cell having a magnetic layer magnetized in a direction in accordance with stored data;

a plurality of bit lines provided corresponding to respective prescribed sections of said plurality of magnetic memory cells;

a plurality of first and second bit line drivers provided corresponding to respective ends of said plurality of bit lines to pass a data write current for generating a data write magnetic field for magnetization of said magnetic layer to at least one of said plurality of bit lines at the time of data write;

a read data line provided along a direction crossing said plurality of bit lines for transmitting read data; and a read select gate for connecting one of said plurality of bit lines connected to selected one of said plurality of memory cells to said read data line at the time of data read;

said read select gate and said read data line being arranged in a region corresponding to a central portion of said plurality of bit lines.

8. A thin film magnetic memory device, comprising:

a plurality of magnetic memory cells each having a magnetic layer magnetized in a direction in accordance with stored data, said plurality of magnetic memory cells being divided and arranged into first and second memory blocks;

a plurality of bit lines provided in each of said first and second memory blocks corresponding to respective prescribed sections of said plurality of magnetic memory cells;

a plurality of first and second bit line drivers provided in each of said first and second memory blocks corresponding to respective ends of said plurality of bit lines to pass a data write current for generating a data write magnetic field for magnetization of said magnetic layer to at least one of said plurality of bit lines at the time of data write;

a read data line provided commonly for said first and second memory blocks along a direction crossing said plurality of bit lines and for transmitting read data from selected one of said plurality of memory cells; and a read select gate provided independently for each of said first and second memory blocks for connecting said read data line to an intermediate node of one of said plurality of bit lines connected to said selected memory cell at the time of data read;

said read select gate and said read data line being arranged in a region between said first and second memory blocks.

* * * * *